United States Patent [19]

Hirano et al.

[11] Patent Number: 5,281,769

[45] Date of Patent: Jan. 25, 1994

[54] DEWALL PLATING TECHNIQUE

[75] Inventors: Makoto Hirano, Tokyo; Kazuyoshi Asai, Atsugi; Yuhki Imai, Sagamihara; Masami Tokumitsu, Isehara; Tsuneo Tokumitsu; Ichihiko Toyoda, both of Yokosuka, all of Japan

[73] Assignee: Nippon Telegraph and Telephone Corporation, Tokyo, Japan

[21] Appl. No.: 787,136

[22] Filed: Nov. 4, 1991

[30] Foreign Application Priority Data

| Nov. 5, 1990 | [JP] | Japan | 2-299500 |
| Feb. 15, 1991 | [JP] | Japan | 3-042954 |
| Feb. 15, 1991 | [JP] | Japan | 3-042955 |
| Feb. 25, 1991 | [JP] | Japan | 3-053355 |
| Mar. 4, 1991 | [JP] | Japan | 3-062725 |
| Mar. 4, 1991 | [JP] | Japan | 3-062726 |
| Jul. 10, 1991 | [JP] | Japan | 3-195001 |

[51] Int. Cl.$^5$ .............................. H05K 1/00
[52] U.S. Cl. .................. 174/250; 361/784; 257/528
[58] Field of Search ............. 174/261, 250; 361/412; 257/379, 528

[56] References Cited

U.S. PATENT DOCUMENTS 3,674,914 7/1972 Burr .
3,913,219 10/1975 Lichtblau .

FOREIGN PATENT DOCUMENTS 0234563 2/1986 European Pat. Off. .

OTHER PUBLICATIONS

Japanese Abstract, vol. 12, No. 55 (M669) (2902) published Feb. 19, 1988.
European Search Report No. EP 91 11 8902.

*Primary Examiner*—Leo P. Picard
*Assistant Examiner*—Cheryl R. Figlin
*Attorney, Agent, or Firm*—Finnegan, Henderson, Farabow, Garrett & Dunner

[57] ABSTRACT

A new design concept is presented and demonstrated for the fabrication of active and passive components in integrated circuit (IC) devices for microwave signal transmission. High circuit packing density is desirable but the current configurations of the conventional flat strip type conductors present physical limitations to achieving such an objective. The new conductor configuration not only overcomes such circuit packing problems of the conventional line design, but provides additional improvements in performance parameters, such as lower circuit resistance and lower parasitic interactions; an ability to fabricate circuits to design specifications and to improve reliability at low cost. The new concept has been applied to the fabrication of transmission lines, capacitors, inductors, air bridges and to formulating the fabrication steps for a FET. Polyimide film enables an improved fabrication step to be performed in the invention, and a new processing technique for polyimide material has also been demonstrated.

8 Claims, 40 Drawing Sheets

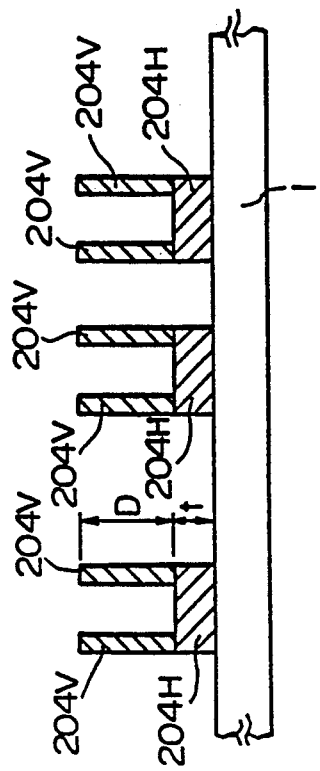
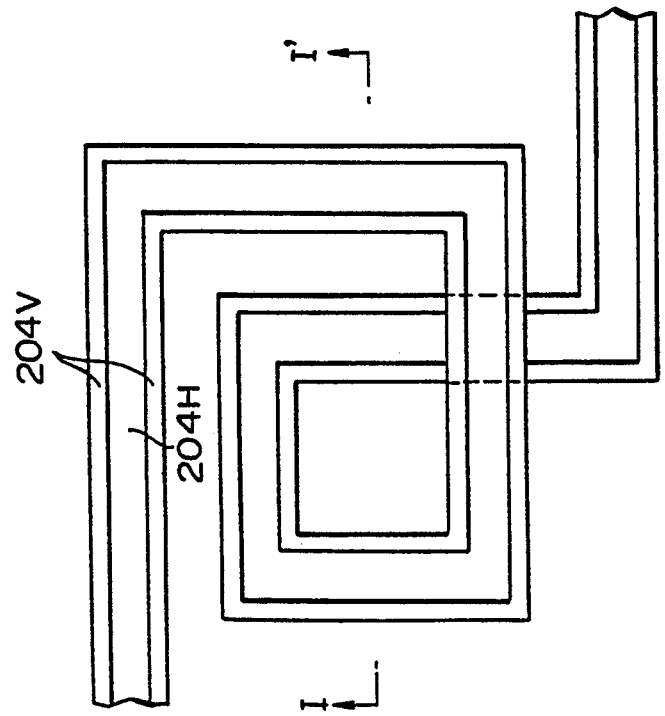
FIG.32(a)
FIG.32(b)

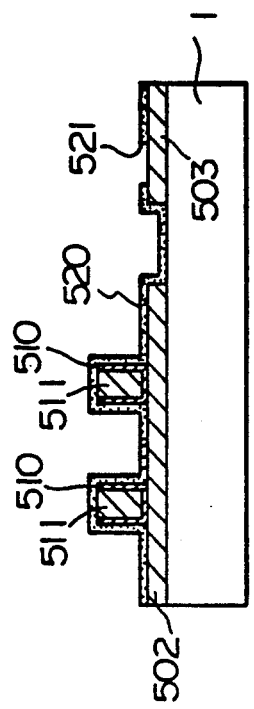
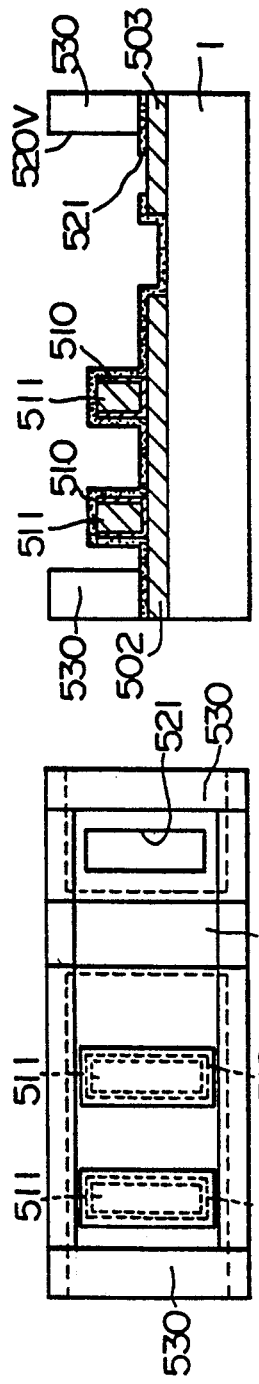
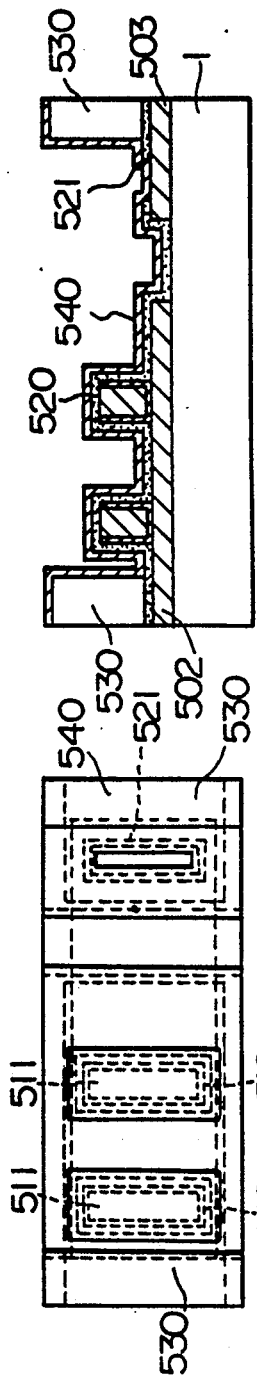

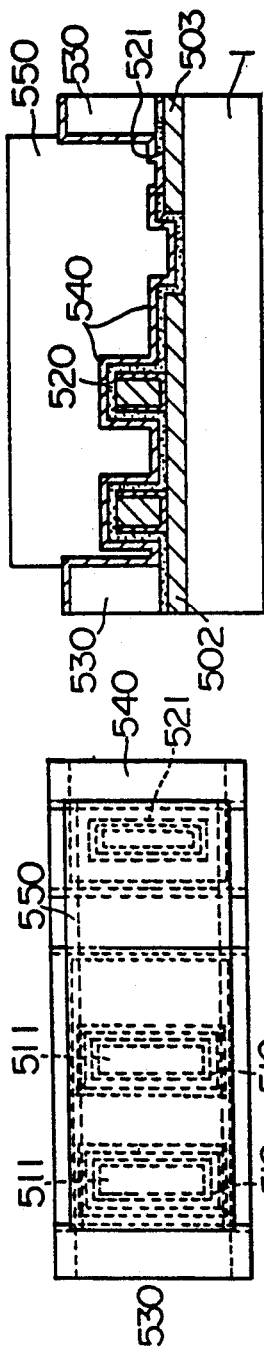
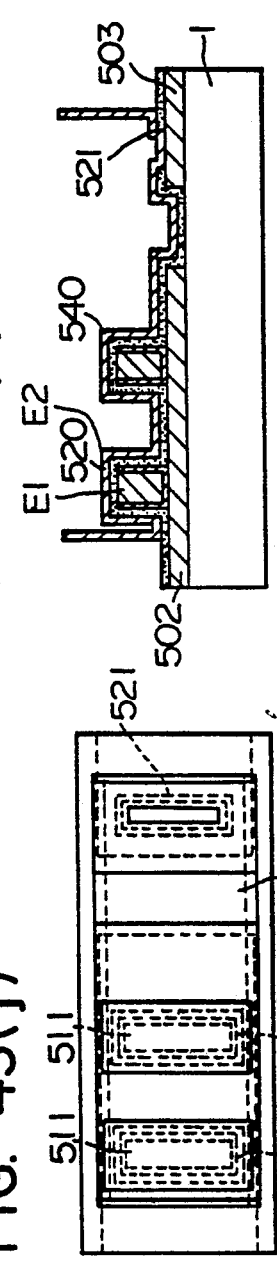
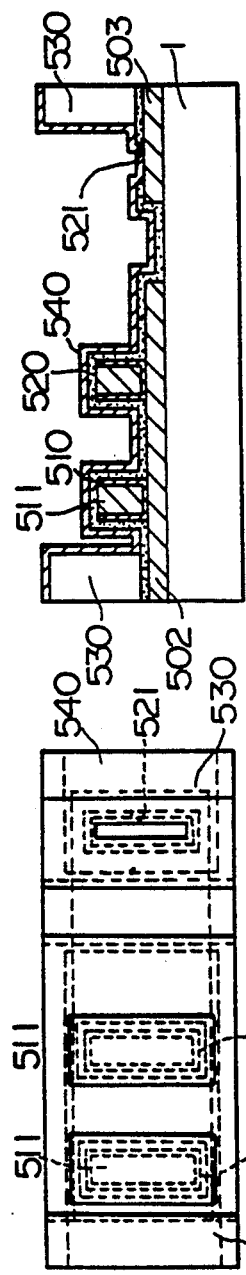
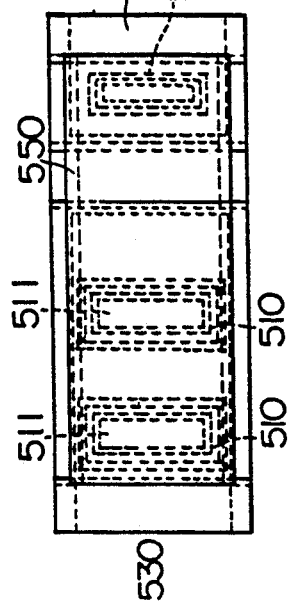
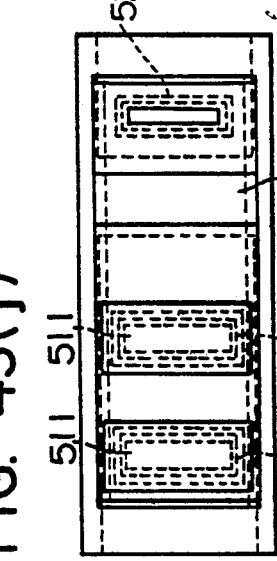
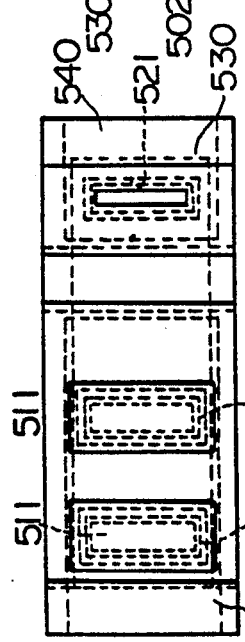

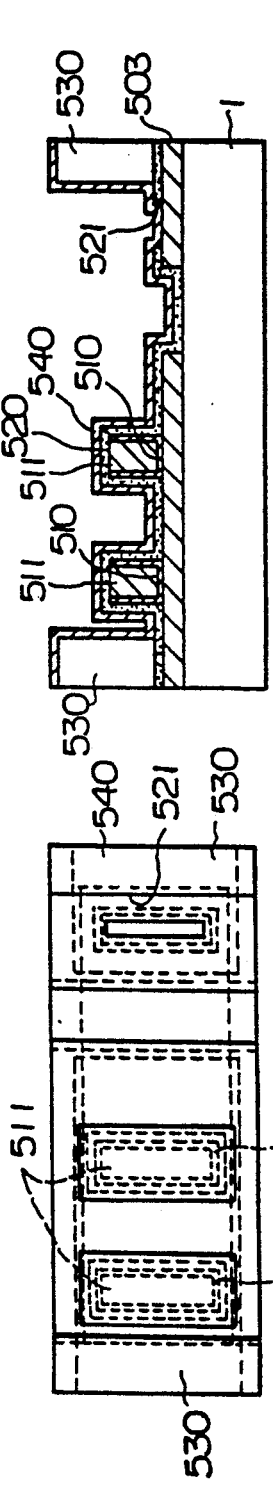
FIG. 45(a)
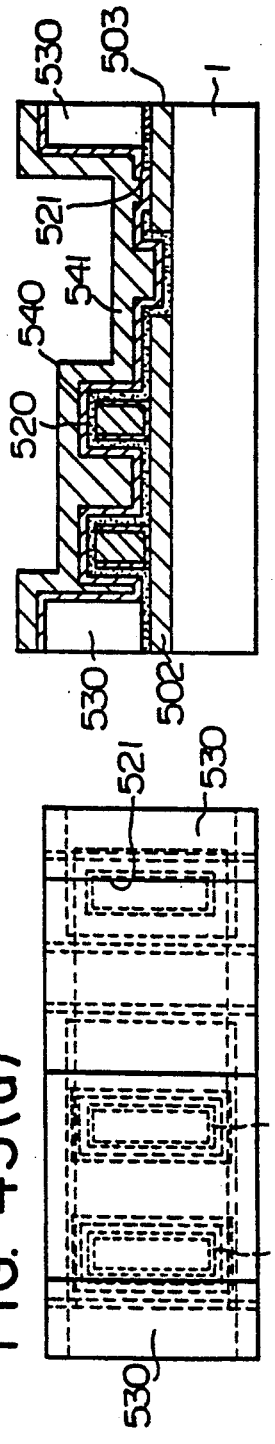
FIG. 45(b)
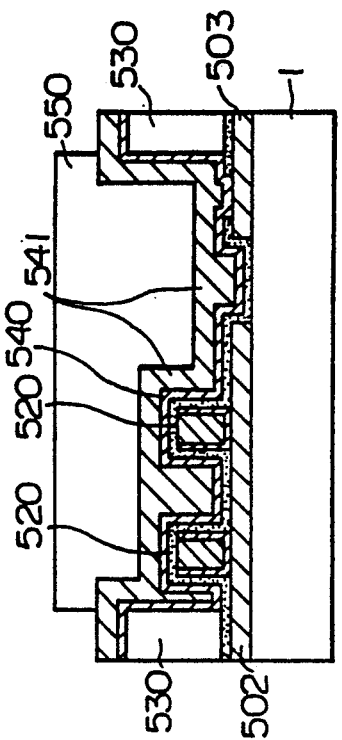
FIG. 45(e)
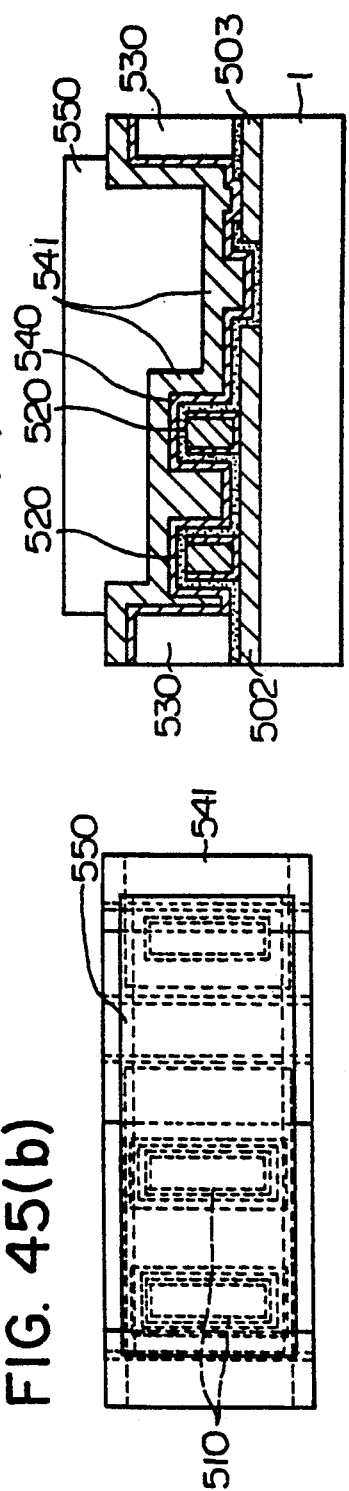
FIG. 45(f)
FIG. 45(c)
FIG. 45(g)

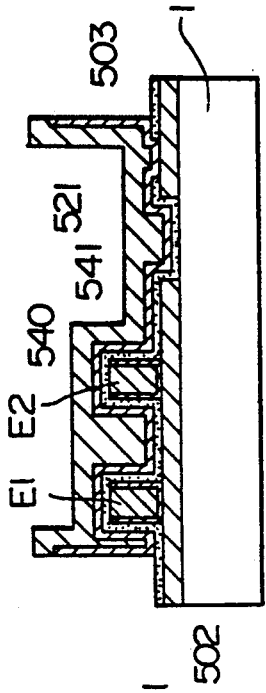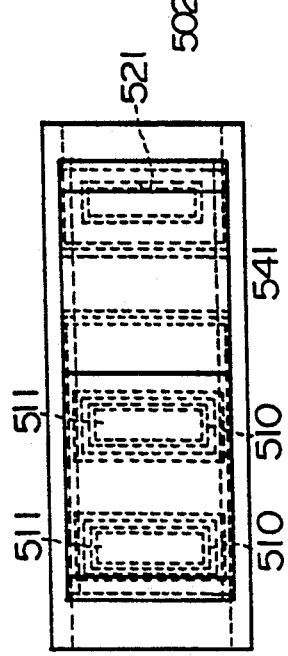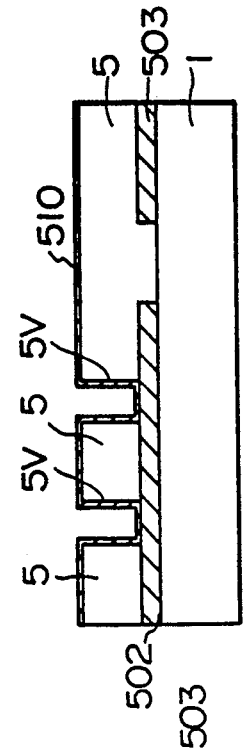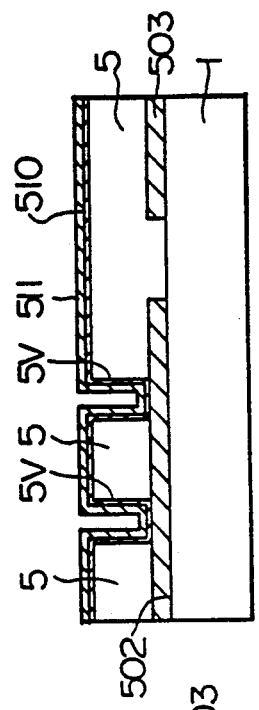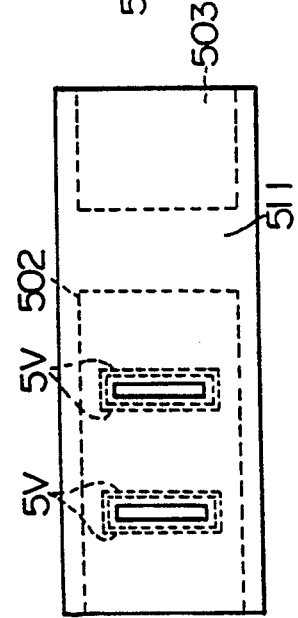

DEWALL PLATING TECHNIQUE

FIELD OF THE INVENTION

This invention relates to a process of fabricating circuits in integrated circuit (IC) devices, and is particularly applicable to the fabrication of monolithic microwave ICs operating at microwave frequencies.

BACKGROUND OF THE INVENTION

Rapid communication is essential in modern business, and a world wide communication system by mobile communication technology, including satellite stations, is becoming more readily accessible for civilian uses.

Commercial opportunities in the consumer field cannot be developed unless the cost of producing microwave communication equipment is lowered and their reliability increased. An important step in achieving such an objective is monolithic microwave integrated circuit (MMIC), which could offer a potential for high circuit packing density, reliability and low cost. There are many barriers to overcome before such an objective can be achieved, however, and a major one is the deviation of circuit performance from the design specifications, because of the many problems involved in fabricating the devices which are based on GaAs substrates.

At high frequencies associated with microwave operations, a number of technical problems arises to prevent a direct application of the manufacturing technology based on the conventional silicon-IC fabrication. The performance requirements dictate that the substrate material be of high mobility, insulating gallium arsenide. Signal loss in microwave circuits can be caused by two effects: localization of signals in the surface of a conductor close to the ground line; and another localization effect known as the skin effect at microwave frequencies. These effects dictate that device quality and fabricability considerations be given in the early stages of circuit design. Circuit resistance and parasitic interactions present much more serious problems of signal transmission losses in GaAs-based devices than in Si-based devices.

It is also evident that practical MMIC technology requires a fundamental rethinking in the transmission line and active element designs, because of the limited choices presently available in the circuit fabrication processes developed in association with the current silicon based technology. The current state of the art of fabricating circuits in the MMIC technology is illustrated in the following.

Description of the Conventional Fabrication Technique

The conventional steps for fabricating transmission lines, of about 10 $\mu$m width by 1 to 2 $\mu$m depth, for transmitting microwave signals on a substrate material are described with reference to FIGS. 1 (a) to (g).

A circuit means 2 is fabricated on an insulating substrate material 1 with suitable technique to produce a structure illustrated in FIG. 1 (a).

An insulation layer 3, made of a photoresist material for example, and providing an insulation between the circuit means 2 and a circuit which will be fabricated thereon, is formed on the substrate material 1, to produce a structure illustrated in FIG. 1 (b).

An electrically conductive (hereinafter shortened to conductive) layer 4 is deposited, by sputtering, on top of the substrate material 1, on the circuit means 2 and on the insulation layer 3 extending throughout, to produce a structure illustrated in FIG. 1 (c).

A deposition masking layer 5 for masking the window, made of a photoresist for example, is formed on top of the conductive layer 4, in which two windows are provided defining the patterns for windows 6A and 6B, which are required for the corresponding regions on the circuit means 2, to produce a structure illustrated in FIG. 1 (d). In the plan view, the window 6A extends across the circuit means 2 on top of the insulation layer 3 while the window 6B is in electrical contact with the circuit means 2.

Conductive layers 7A and 7B are built up in the windows 6A and 6B by means of an electroplating technique utilizing the conductive layer 4 as a plating electrode so as to fill in the regions defined by the window 6A and 6B, to produce a structure illustrated in FIG. 1 (e).

Next, the masking layer 5 is removed from the conductive layer 4 by such technique as dissolution treatment, to produce a structure illustrated in FIG. 1 (f).

The conductive layer 4 is removed, by using techniques applicable to removing of metallic layer such as ion milling for example, from the surface of circuit means 2 and the insulation layer 3 while leaving that region of the conductive layer 4 below 7A and 7B intact as conductive layers 8A and 8B. This is followed by removal of the insulation layer 3, by using techniques applicable to removing of insulation layer 3, such as dissolution treatment, from the surface of the insulating substrate material 1 and the circuit means 2, thereby forming the circuit means 9A which consists of the circuit means 2, the wide and flat conductive layers 7A, 8A and the insulation 10; and the circuit means 9B which consists of the wide and flat conductive layers 7B, 8B and the circuit means 2.

The circuit resistance can be reduced by increasing the thickness of the conductive layers 7A and 7B in the conventional electrolytic plating techniques to produce circuit means 9A and 9B of a low circuit resistance. The conductor thickness fabricated by the conventional technique is usually between 1 to 2 $\mu$m, and the width is up to about 10 $\mu$m.

However, in the conventional step illustrated in FIG. 1 (d) in preparation for the plating process, it can be seen that the plating electrolyte comes into contact with the windows 6A and 6B within the masking layer 5. The plating electrolyte causes corrosion of the masking layer 5, leading to degradation of the carefully designed shape of the cavity of the window circuit patterns. This causes the conductive layers 7A and 7B to be formed in a shape deviating from the designed patterns, thereby leading to the deviation of the performance of circuit means 9A and 9B from the design specifications.

Furthermore, in the step of fabricating the conductive layers 8A and 8B by removing the conductive layer 4, because the removal technique employed is a line-of-sight type technique (ion milling), the shadowed regions cast by the conductive layers 7A and 7B affect the removal process in such a way that a thin layer of the conductive layer 4 can remain in the shadowed regions between the conductive layers 7A and 7B. This often causes problems of shorting of the conductive layers 8A and 8B. If the duration of removal step is prolonged to prevent such a situation from occurring, it leads to the creation of milling damages on the surface of the insulating substrate material 1.

SUMMARY OF THE INVENTION

The present invention presents a new perspective on the basic design of transmission lines and active/passive components. The invented fabrication process can be practiced using the available processing equipment, and the fabricated devices provide reproducible results and reliable high performance economically.

The basic fabrication process invented is termed "sidewall plating technique", which is a plating process developed to enable fabrication of unconventional shapes of transmission lines and active/passive devices to provide microwave devices of high performance characteristics.

A summary of the steps of fabricating the circuit means according to the present invention will be presented with reference to FIG. 2, and will be contrasted with the conventional process illustrated in FIG. 1.

A circuit means 2 is fabricated on the surface of an insulating substrate material 1 as in the conventional technique, to produce a structure illustrated in FIG. 2 (a). An insulation layer 3 is formed on the surface of the insulating substrate material 1 as in the conventional technique, to produce a structure illustrated in FIG. 2 (b).

The next step is to provide the window masking layer 5 to define the window patterns. This processing sequence of the present invention differs critically from the conventional process. In the conventional technique, the metal layer 4 is formed first followed by the step of forming the insulation layer 3 as illustrated in FIGS. 1 (c) and (d). In contrast in this invention, the step of forming the window masking is performed first followed by the step of forming the metal layer 4, as illustrated in the sequence in FIGS. 2 (c) and (d). The deposition masking 5 in the present invention is made either from a polyimide film or a photoresist material to achieve a selected thickness. This masking film defines the window patterns for the windows 6A and 6B to correspond with the designed circuit means, to produce a structure illustrated in FIG. 2 (c). Polyimide film is useful in some cases while a photomasking material is applicable in other situations, both enabling the sharp definition of the narrow and deep window cavity to be fabricated, which is essential in the sidewall plating technique.

Next, a conductive layer 11, such as gold, is formed by such technique as sputtering, on the surface of the deposition masking layer 5, including the cavity surfaces of the window regions 6A and 6B to produce a structure as illustrated in FIG. 2 (d). In a desirable variation, the conductive layer 11 may consist of two sublayers, the first sublayer immediately next to polyimide is tungsten or tungsten alloys, and the second sublayer is gold. This double layer structure of the first conductive layer provides improved adhesion of the conductive layer to the polyimide film masking layer 5.

Next, on the surface of the conductive layer 11, a conductive deposit 12, for example a metallic material such as gold, is deposited by electrolytic plating, by using the conductive layer 11 as a plating electrode, so as to fill the cavity of the window regions of 6A and 6B, to produce a structure illustrated in FIG. 2 (e).

The conductive layer 11 and the deposit 12 are then subjected to a removal step from the top direction by a suitable technique, such as ion milling, to fabricate transmission line elements, having a narrow and deep cross sectional shape (N&D configuration) 15A, consisting of a conductive layer 13A and a conductive deposit 14A, and 15B, consisting of similar conducting components 13B and 14B, to produce a structure illustrated in FIG. 2 (f).

Next, the masking layers 3 and 5 are either removed or left on, depending on the type of circuit to be fabricated next. Parasitic capacitance is decreased by removing the insulation while the flat platform of the polyimide is advantageous to other circuit designs. FIG. 2 (g) illustrates a case so as to correspond with FIG. 1. A circuit means 15A bridges the circuit means 2 over the insulation 10, and circuit means 15B is electrically connected to the circuit means 2.

In order to practice the sidewall plating technique effectively as described above, an essentially step is an insulation material of suitable thickness processed in the described manner.

The sidewall plating technique is applicable to producing planar components of low circuit resistance in analogue circuits, such as:

(a) signal transmission lines of low circuit losses;
(b) active/passive device fabrication in a three dimensional architecture;
(c) microstrip (MS), coplanar (CP) and slot line (SL) configurations of low parasitic interference and low circuit losses;
(d) inductive components of low parasitic interference and circuit losses;
(e) capacitive components having a large surface area, thus providing opportunities for designing in many capacitors in a limited occupation area of an IC devices;
(f) FET devices of high performance having a low gate resistance; and
(g) air bridge structures of a long span which resists flexural deformation at high loading.
(h) in all of the above mentioned structures, a common advantage is that the circuit packing density can be increased significantly in almost all cases because of the high aspect ratio of the components which can be achieved.

The sidewall plating technique is being applied to the development of compact analogue devices having low power consumption. The same technique is basically applicable to producing circuit elements in high performance digital circuitry. It is important to achieve high packing density in the digital circuits by having narrow and deep components which can be disposed closely on a substrate material and yet provide effective performance. The sidewall plating technique is expected to be able to produce even narrower circuit components in the future, thereby providing further opportunities for increasing the circuit packing density in a given occupation area. The circuit density can be increased many fold, thus leading to portable compact digital devices of excellent performance characteristics.

BRIEF DESCRIPTION OF THE DRAWINGS

In most of the following figures, the cross sectional shape is taken on a pane I—I' perpendicular to the signal direction, unless otherwise moted. Therefore the signal travels perpendicular to the plane of the paper. The exception is FIG. 11.

FIGS. 32a-32b show an example of using a channel-shaped conductor to fabricating an inductive element.

FIGS. 43a-43k are plan views illustrating the steps for fabricating a capacitive element according to the sidewall plating technique.

FIGS. 43l-43v being cross sectional views of FIGS. 43a-43k.

FIGS. 45a-45d are plan views illustrating the steps for fabricating a capacitive element having a wide and flat platform on the second conductive layer.

FIGS. 45e–45h being cross sectional views of FIGS. 45a–45d.

DETAILED DESCRIPTION OF THE PREFERRED EMBODIMENTS

Figure 1A:
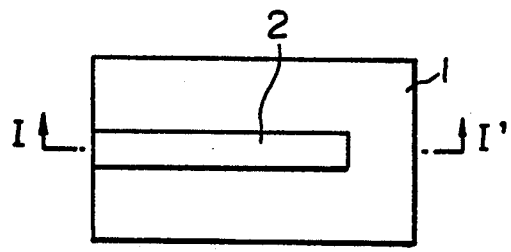
FIGS. 1a—g are plan views illustrating the steps in the conventional fabrication technique of forming circuit means on a substrate material FIGS. 1h–1o being cross sectional views of FIGS. 1a–1g taken along the line I—I'.
Figure 1H:
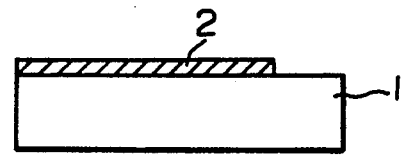
Figure 1B:
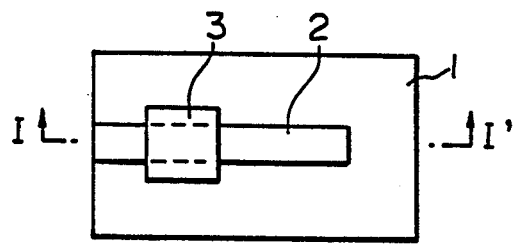
Figure 1I:
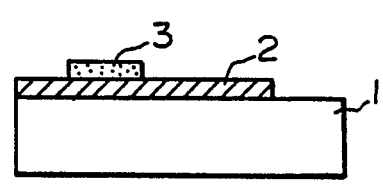
Figure 1C:
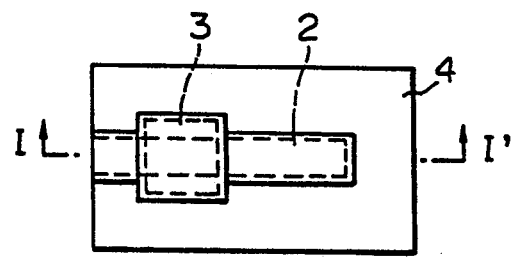
Figure 1K:
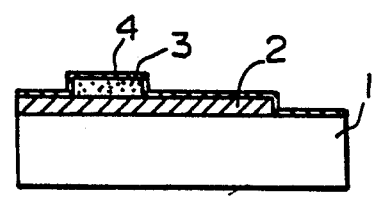
Figure 1D:
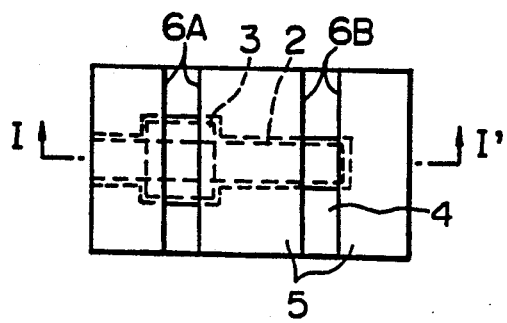
Figure 1L:
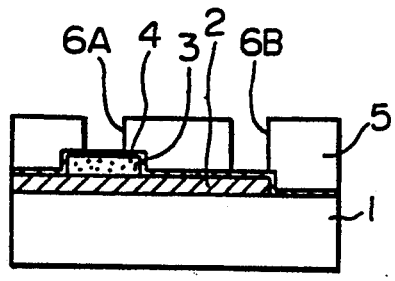
Figure 1E:
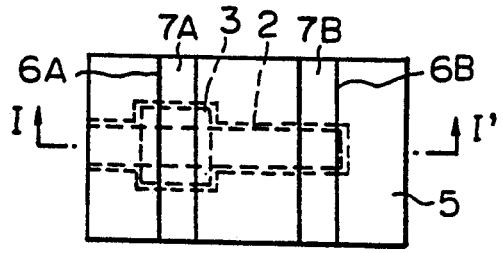
Figure 1M:
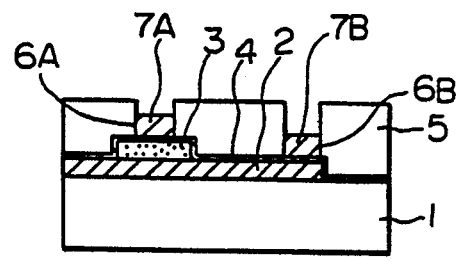
Figure 1F:
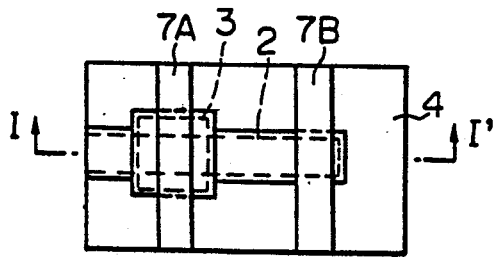
Figure 1N:
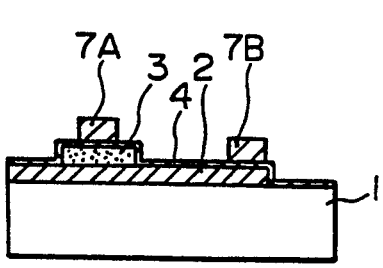
Figure 1G:
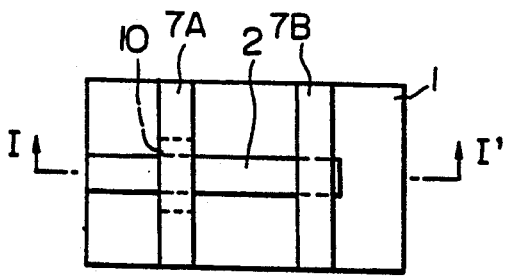
Figure 1O:
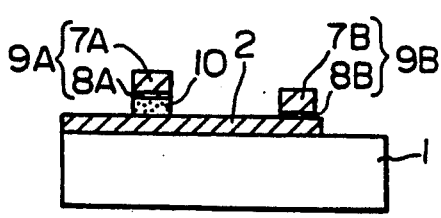
Figure 2A:
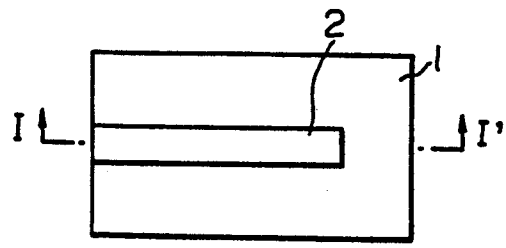
FIGS. 2a—g are plan views illustrating the fabrication steps according to the sidewall plating technique FIGS. 2h-2n being cross sectional views of FIGS. 2a-2g taken along the line I—I'.
Figure 2H:
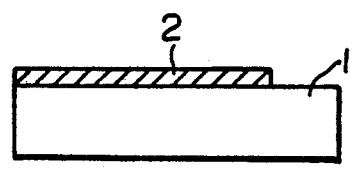
Figure 2B:
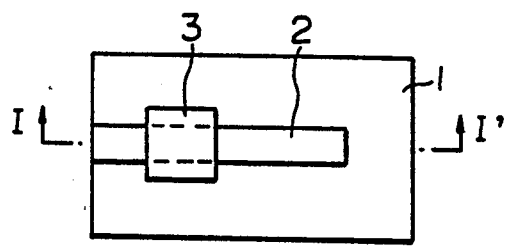
Figure 2I:
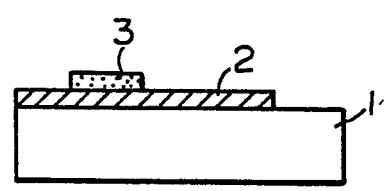
Figure 2C:
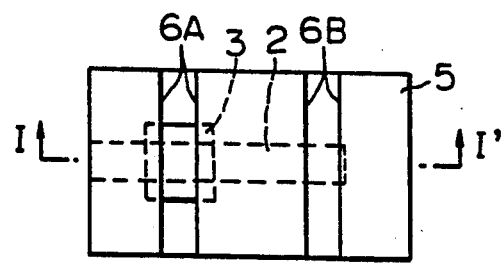
Figure 2J:
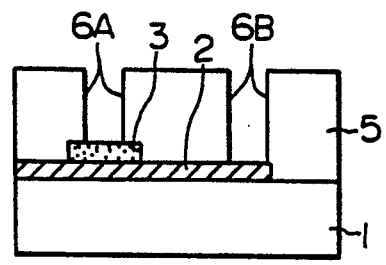
Figure 2D:
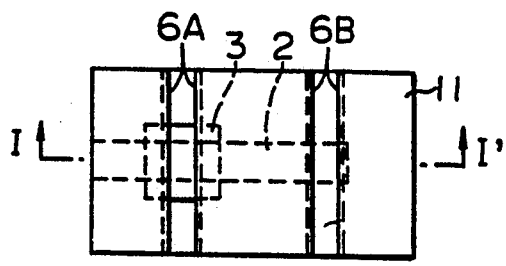
Figure 2K:
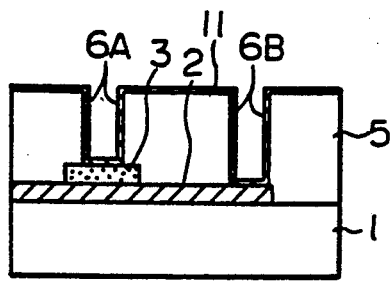
Figure 2E:
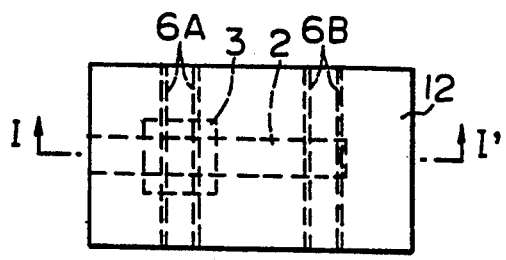
Figure 2L:
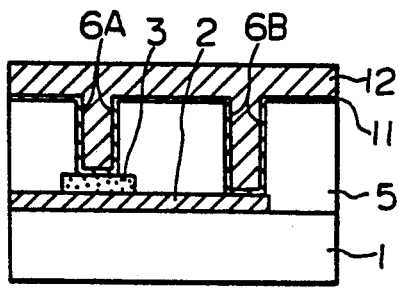
Figure 2F:
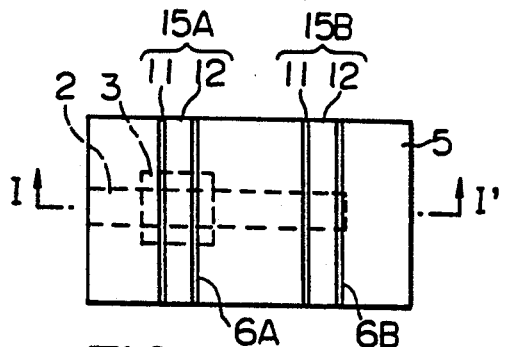
Figure 2M:
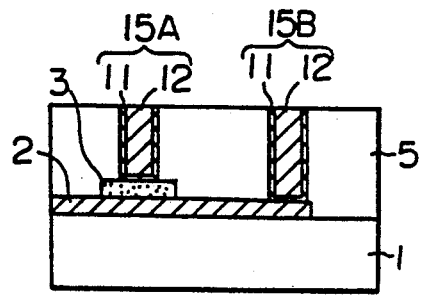
Figure 2G:
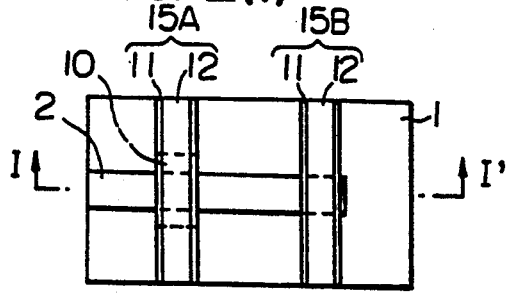
Figure 2N:
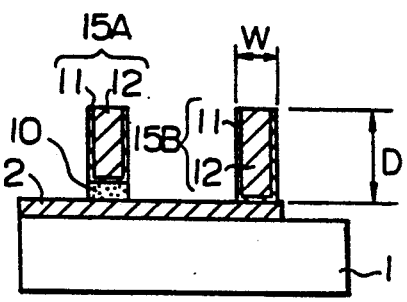
Figure 3A:
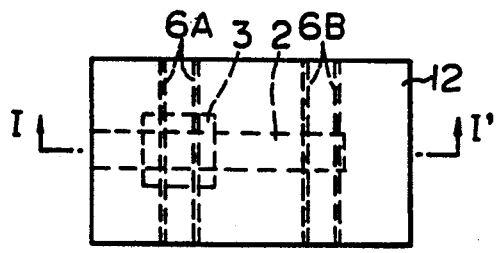
FIGS. 3a—e are plan views illustrating the steps for fabricating stacked circuit means according to the sidewall plating technique FIGS. 3f-3j being cross sectional views of FIGS. 3a-3e taken along the line I—I'.
Figure 3F:
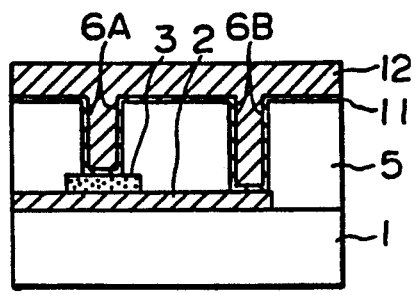
Figure 3B:
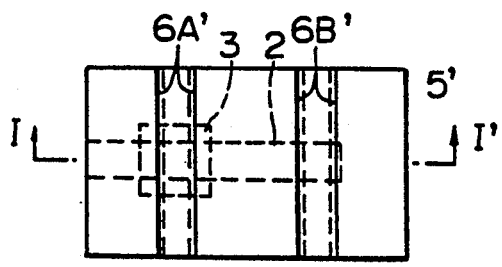
Figure 3G:
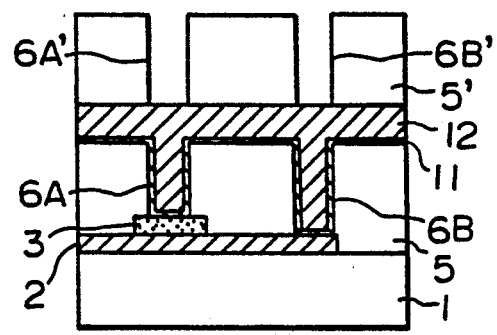
Figure 3C:
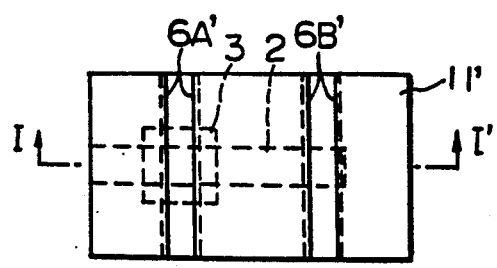
Figure 3H:
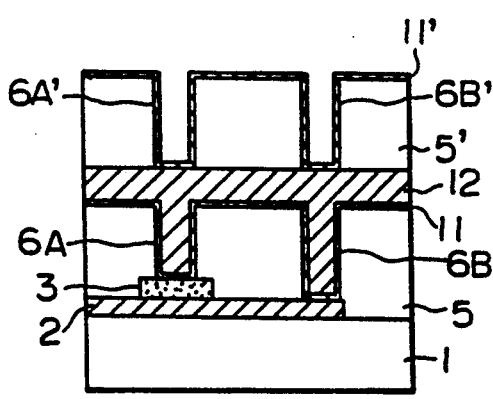
Figure 3D:
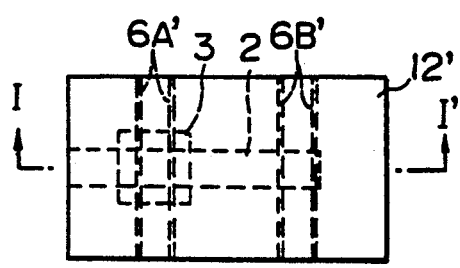
Figure 3I:
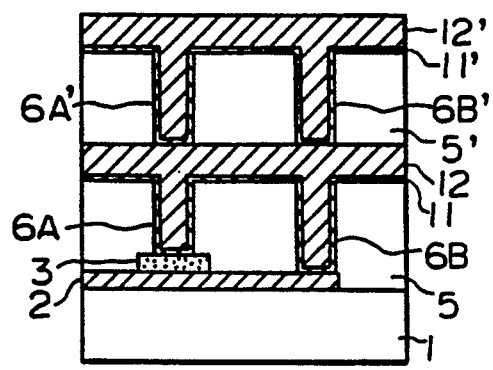
Figure 3E:
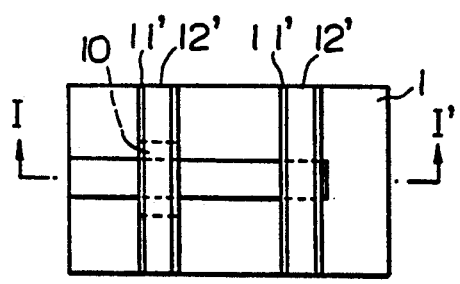
Figure 3J:
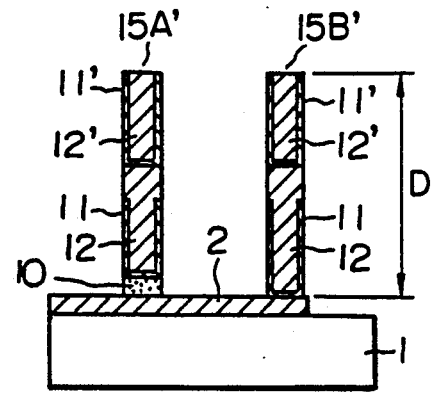
Figure 4A:
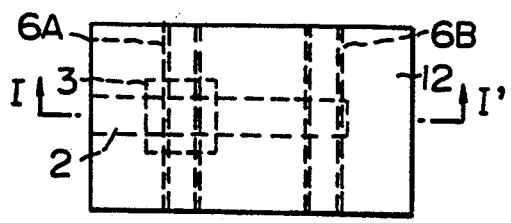
FIGS. 4a—d are plan views illustrating the fabrication steps for varying the depth of a conductive deposit FIGS. 4e-4h being cross sectional views of FIGS. 3a-3e taken along the line I—I'.
Figure 4E:
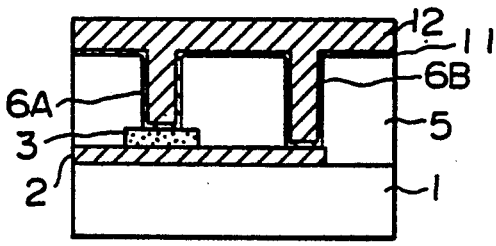
Figure 4B:
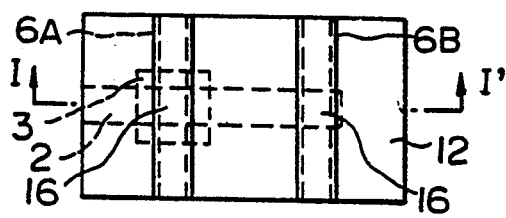
Figure 4F:
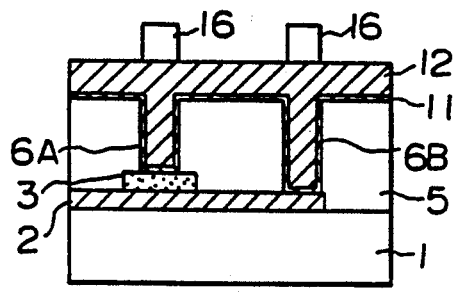
Figure 4C:
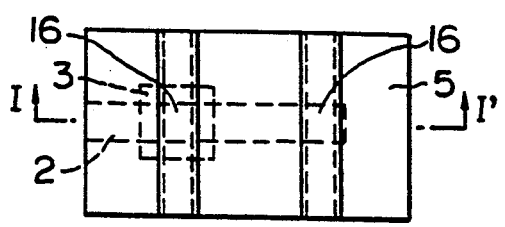
Figure 4G:
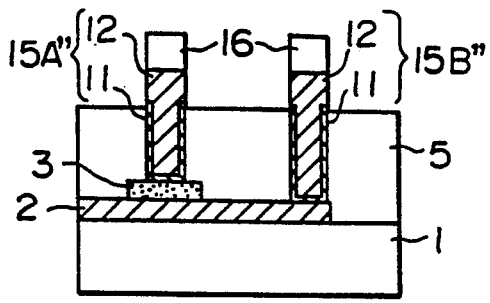
Figure 4D:
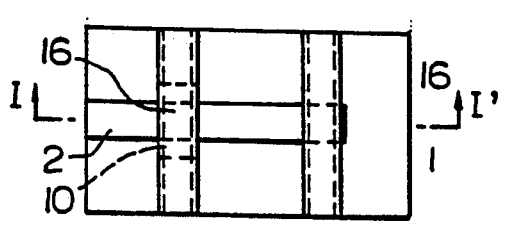
Figure 4H:
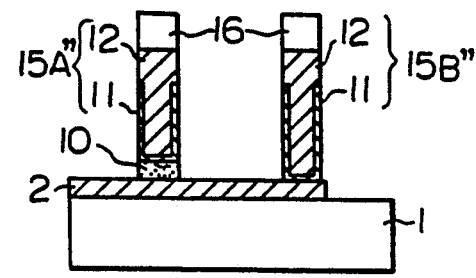
Figure 5A:
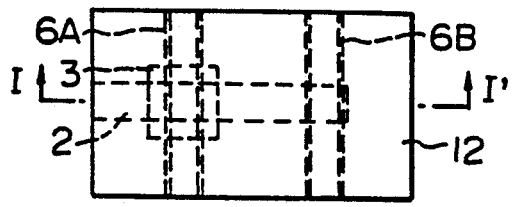
FIGS. 5a-5d are plan views illustrating the steps for fabricating two pairs of conductors of an invL configuration.
Figure 5B:
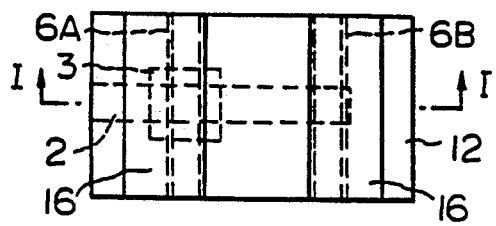
Figure 5C:
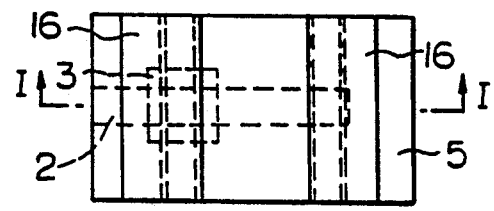
Figure 5D:
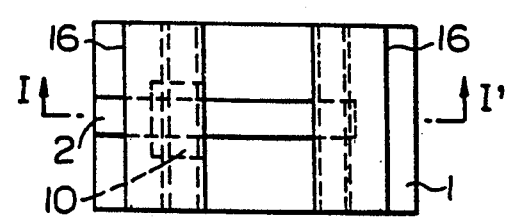
Figure 5E:
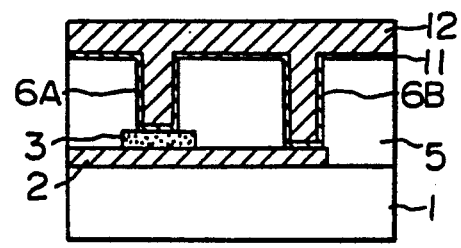
FIGS. 5e-5h being cross sectional views of FIGS. 3a-3e taken along the line I—I'.
Figure 5F:
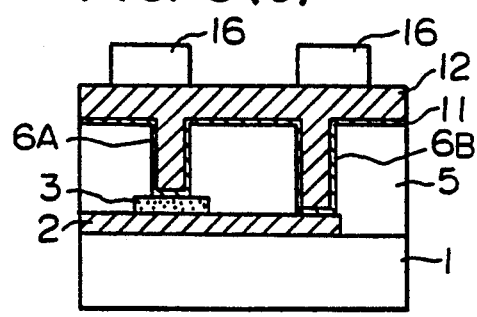
Figure 5G:
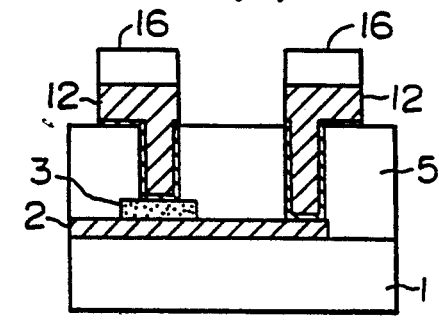
Figure 5H:
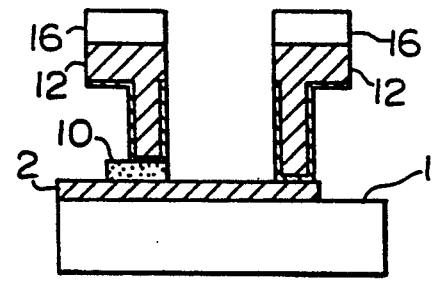
Figure 6A:
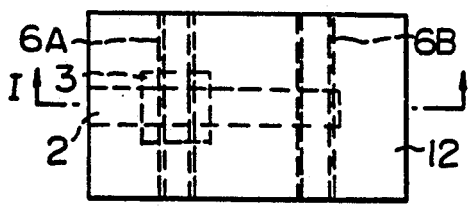
FIGS. 6a-6d are plan views illustrating the steps for fabricating a pair of conductors of a T configuration.
Figure 6B:
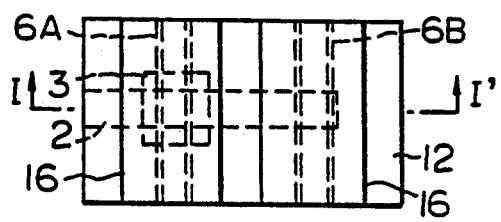
Figure 6C:
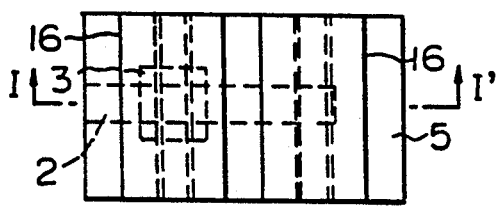
Figure 6D:
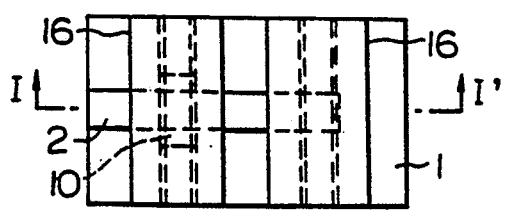
Figure 6E:
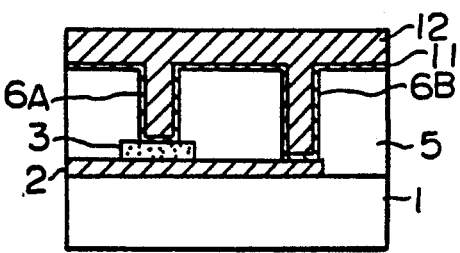
FIGS. 6e-6h being cross sectional views of FIGS. 3a-3e taken along the line I—I'.
Figure 6F:
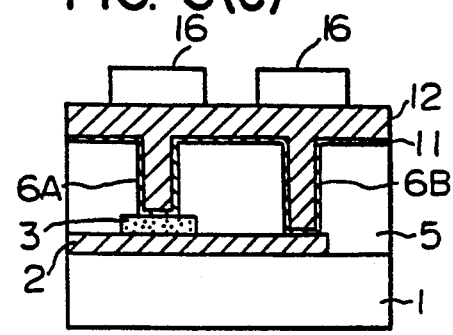
Figure 6G:
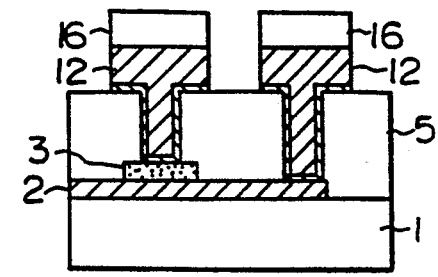
Figure 6H:
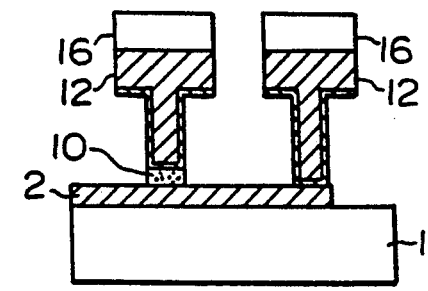
Figure 7A:
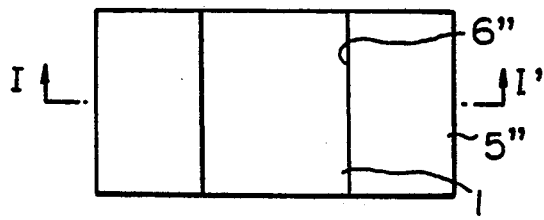
FIGS 7a-7f are plan views illustrating the steps for fabricating a U-shaped channel conductor of wide opening.
Figure 7G:
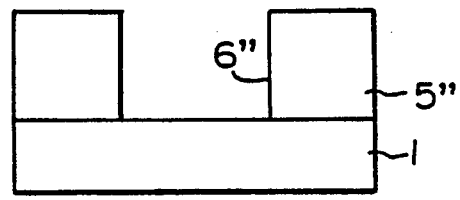
FIGS. 7g-7l being cross sectional views of FIGS. 3a-3e taken along the line I—I'.
Figure 7B:
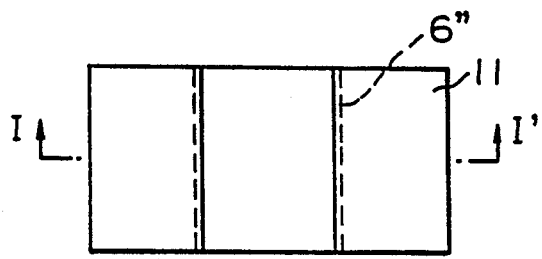
Figure 7H:
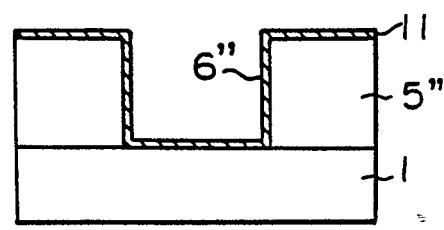
Figure 7C:
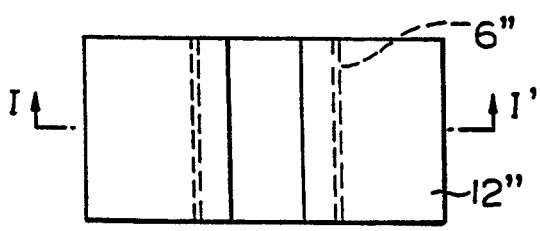
Figure 7I:
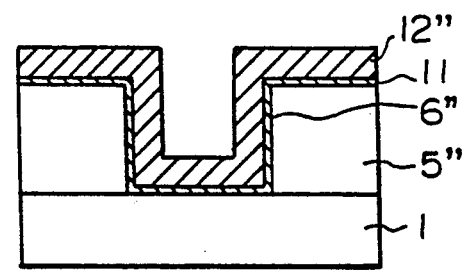
Figure 7D:
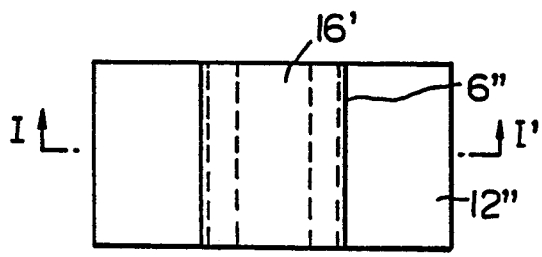
Figure 7J:
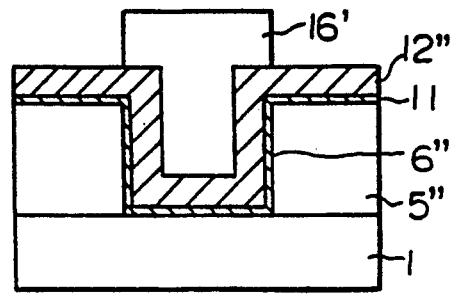
Figure 7E:
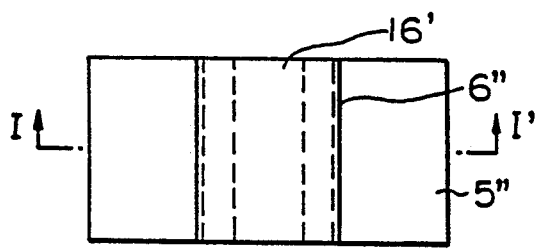
Figure 7K:
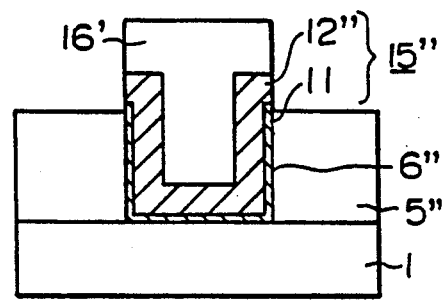
Figure 7F:
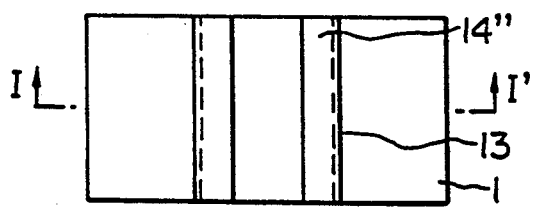
Figure 7L:
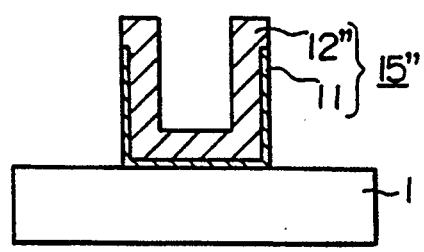
Figure 8A:
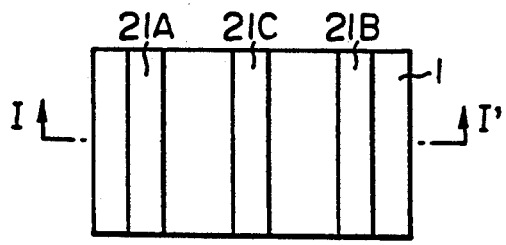
FIGS. 8a-8g are plan views illustrating the steps for fabricating an air bridge structure.
Figure 8H:
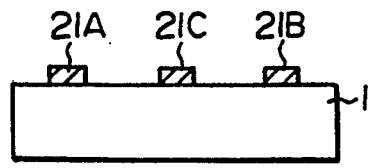
FIGS. 8h-8n being cross sectional views of FIGS. 3a-3e taken along the line I—I'.
Figure 8B:
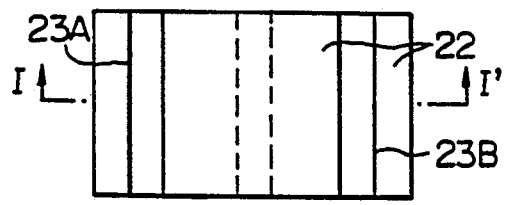
Figure 8I:
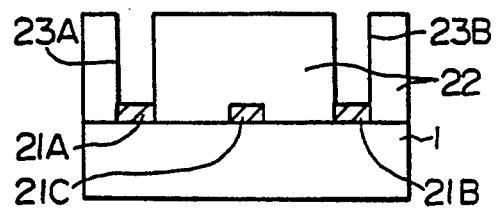
Figure 8C:
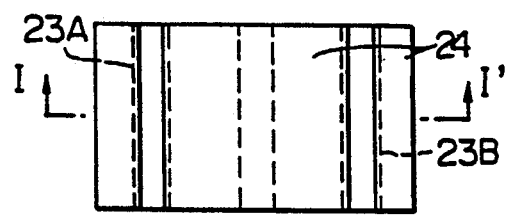
Figure 8J:
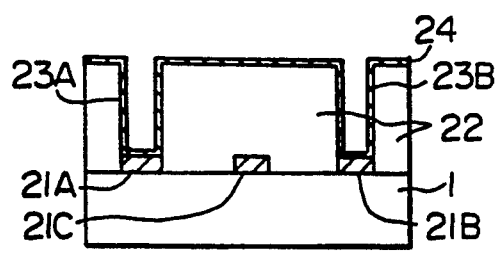
Figure 8D:
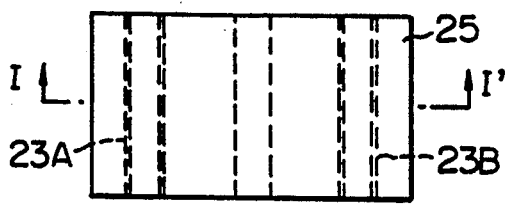
Figure 8K:
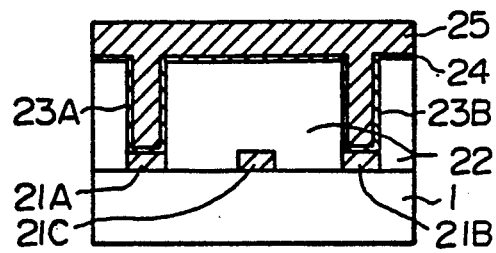
Figure 8E:
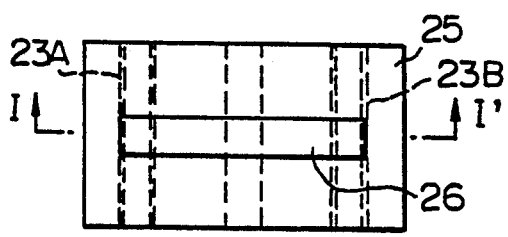
Figure 8L:
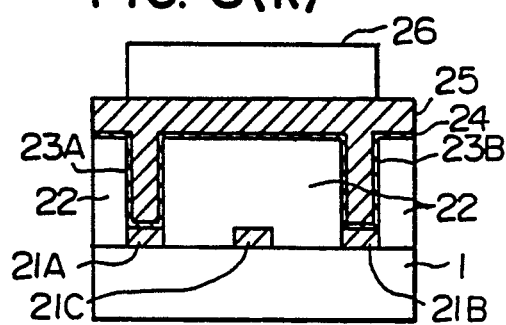
Figure 8F:
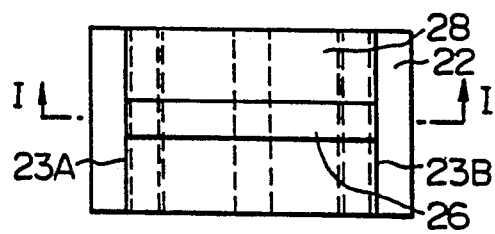
Figure 8M:
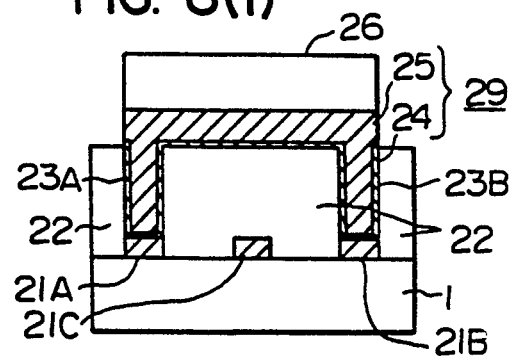
Figure 8G:
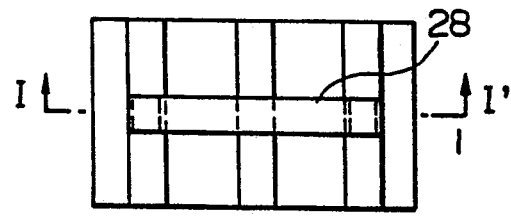
Figure 8N:
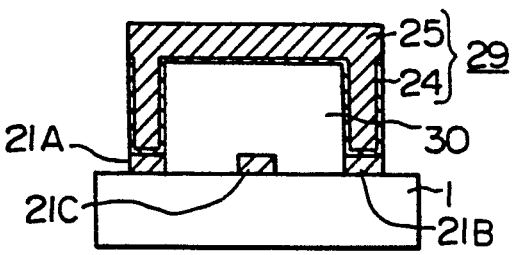
Figure 9A:
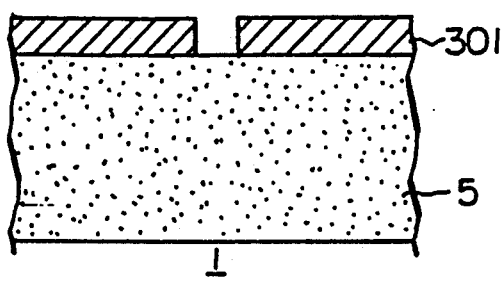
FIGS. 9a-9o illustrate the steps for fabricating a conductor of a stepped configuration according to the sidewall plating technique.
Figure 9B:
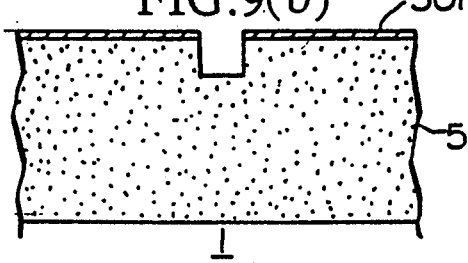
Figure 9C:
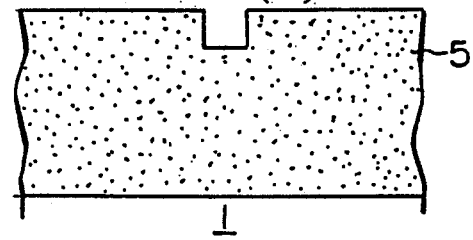
Figure 9D:
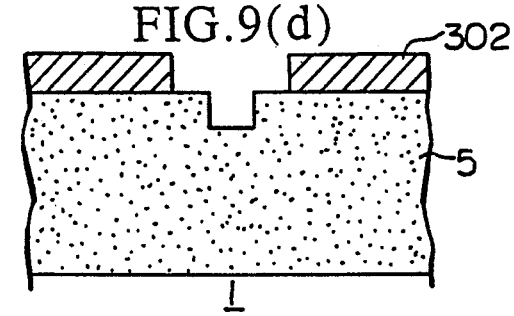
Figure 9E:
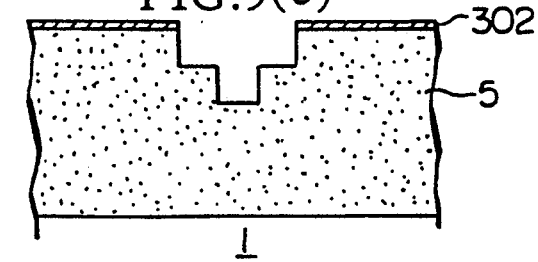
Figure 9F:
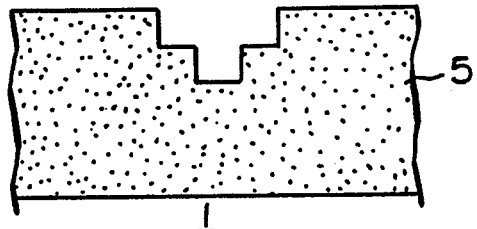
Figure 9G:
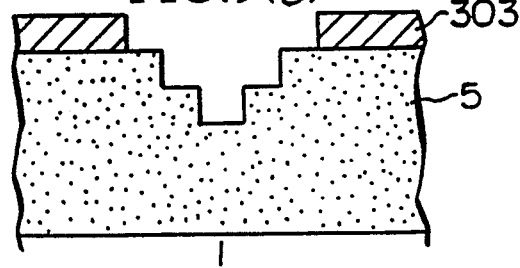
Figure 9H:
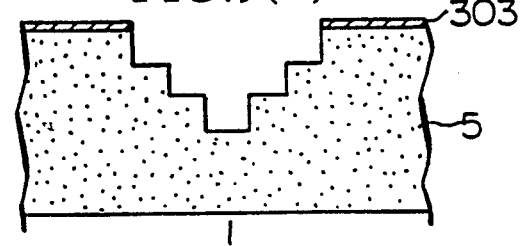
Figure 9I:
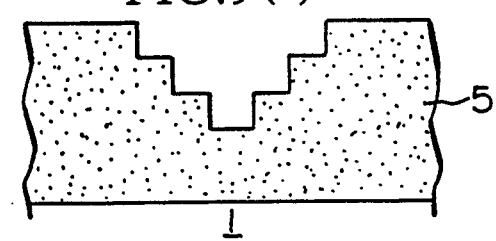
Figure 9J:
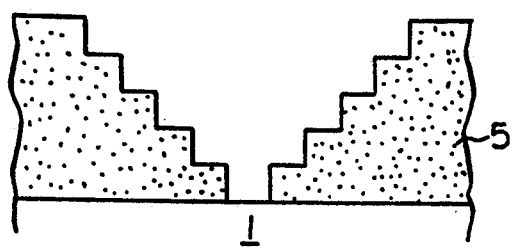
Figure 9M:
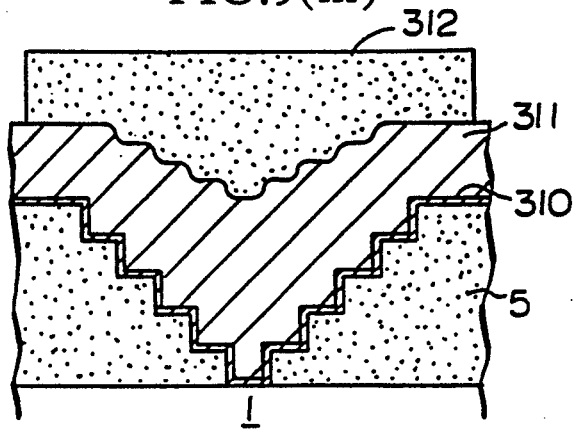
Figure 9K:
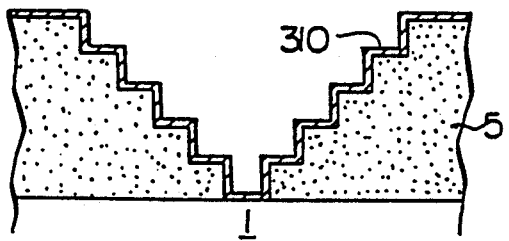
Figure 9N:
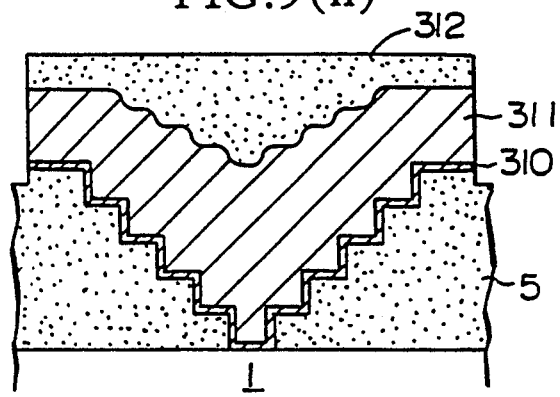
Figure 9L:
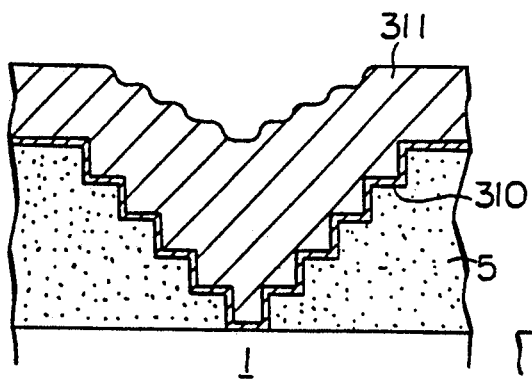
Figure 9O:
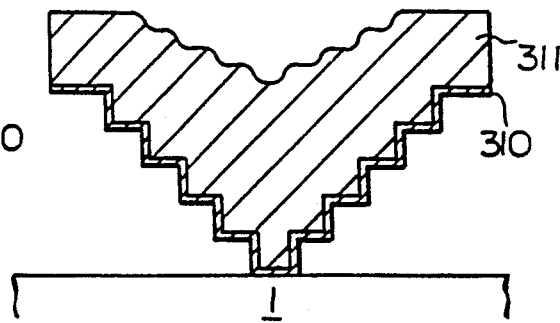
Figure 10A:
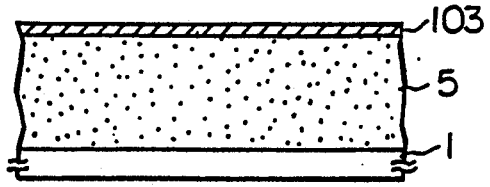
FIGS. 10a-10h illustrate the steps for fabricating a narrow and deep (N&D configuration) window in a polyimide masking film.
Figure 10E:
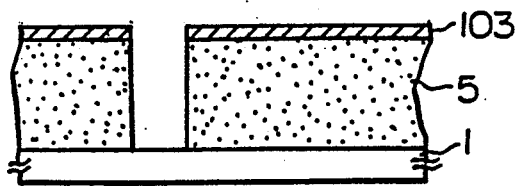
Figure 10B:
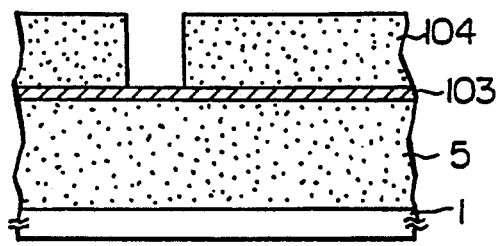
Figure 10F:
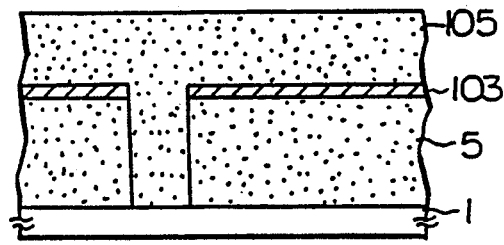
Figure 10C:
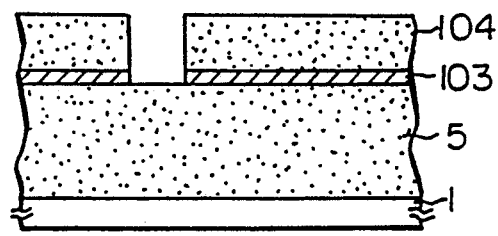
Figure 10G:
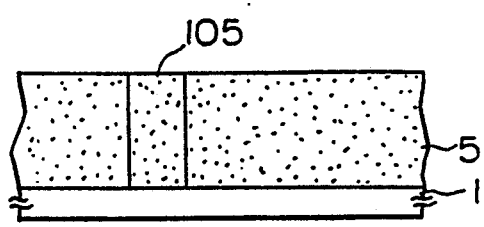
Figure 10D:
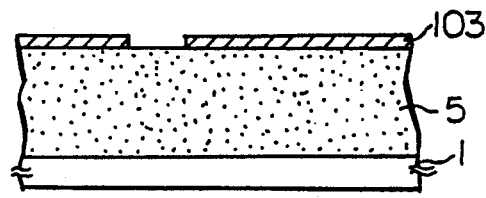
Figure 10H:
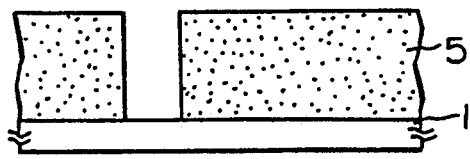
Figure 11A:
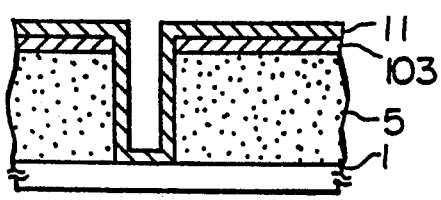
FIGS. 11a-11f is a longitudinal cross section showing a variation of the N&D window fabrication to fabricate a conductor carrying a signal in the left/right direction.
Figure 11E:
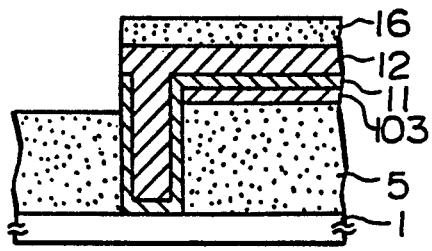
Figure 11B:
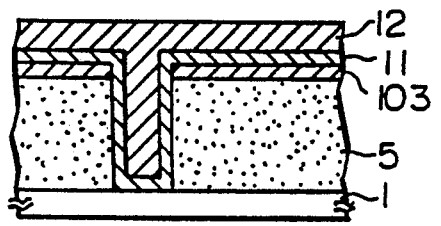
Figure 11F:
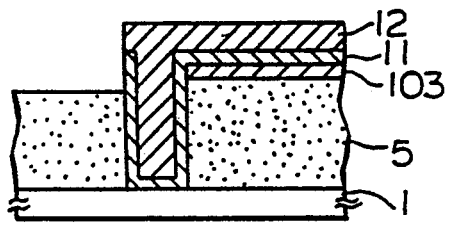
Figure 11C:
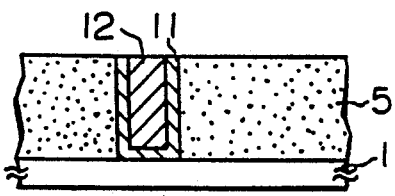
Figure 11D:
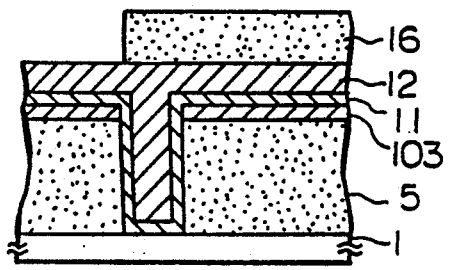

The the following section presents preferred embodiments of the present invention in the following order:
Sidewall plating technique;
Polyimide insulation for circuit formation by the sidewall plating technique;
Application of the sidewall plating technique to fabrication of signal transmission lines;
Application of the sidewall plating technique to fabrication of air bridge structures;
Application of the sidewall plating technique to fabrication of inductive components;
Application of the sidewall plating technique to fabrication of capacitive components.

Each section consists of a brief description of the background of the particular component or technology and the relevance to the various aspects of the invention and to MMIC fabrication.

SIDEWALL PLATING TECHNIQUE

Preferred Embodiments

The steps of fabricating the circuit means according to the first preferred embodiment of the present invention are presented with reference to FIGS. 2 (a) to (g). The same steps as in the conventional technique are designated by the same numerals, and detailed explanations are omitted.

The steps in the first embodiment are as follows. The circuit means 2 is fabricated on the surface of the insulating substrate material 1 as in the conventional technique, illustrated in FIG. 2 (a). The insulation layer 3 is formed on the surface of the insulating substrate material 1 as in the conventional technique, illustrated in FIG. 2 (b).

The next step of providing the masking layer to define the window patterns having a deep window cavity differ critically from the conventional technique. A deposition masking 5 in the present invention is made of a polyimide film having a selected thickness rather than a photoresist masking material in the conventional technique. This masking film defines the window patterns as well as the window shapes, including the profile of the window cavities, for the windows 6A and 6B to correspond with the designed circuit means, as illustrated in FIG. 2 (c). The thickness of the film defines the depth of the window cavity and the subsequent conductive deposit to be formed within. The nature of the film material, which provides rigidity without a baking treatment, significantly improves and maintains the precision of the subsequent processing steps.

Next, a conductive layer 11 is formed, by such technique as sputtering, on the surface of the deposition masking layer 5, including the cavity surfaces of the window regions 6A and 6B to produce a structure illustrated in FIG. 2 (d). In this case, the deposition coverage by the conductive layer 11 extends throughout the surfaces of the window cavity including the side walls of the windows 6A and 6B, and extends from the deposition masking layer 5 over to the regions of the substrate material 1 and of the insulation layer 3 over to the circuit means 2 within the window 6B of the plating mask.

Next, on the surface of the conductive layer 11, a conductive deposit 12, for example a metallic material such as gold, is deposited by electrolytic plating, by using the conductive layer 11 as a plating electrode, so as to fill the cavity of the window regions of 6A and 6B, to produce a structure illustrated in FIG. 2 (e).

The conductive layer 11 and the deposit 12 are then subjected to a removal step from above (i.e. the top side of the figures) by a suitable technique, such as ion milling, to fabricate transmission line elements, having a narrow and deep cross sectional shape (N&D configuration) circuit means 15A, consisting of the conductive layer 11 and the conductive deposit 12, and another circuit means 15B, consisting of similar conducting components 11 and 12, to produce a structure illustrated in FIG. 2 (f). At this stage, if it is required to form a circuit pattern on the surface of the insulating polyimide film, there is no need for a planarization masking step, because the surface profile is already flat and readily accepts circuit fabrication.

Next, the masking layers 3 and 5 are removed by a suitable technique, such as the dissolution technique, from the insulating substrate material 1, thereby forming circuit means 15A bridging the circuit means 2 over the insulation 10, and circuit means 15B electrically connected to the circuit means 2, to produce a structure illustrated in FIG. 2 (g).

The above step completes the description of the first preferred embodiment of producing circuit means having a N&D configuration.

According to the first embodiment, because the conductive deposit 12 is formed by electrolytic plating. it is possible to produce a narrow and deep deposit, thereby permitting to fabricate tall circuit means 15A and 15B of approximately 2 to 4 μm width by 10 μm depth, providing a large conductive area leading to a low circuit resistance.

Additionally, in the step of forming the conductive deposit 12 on the conductive layer 11 by electrolytic plating, because the conductive layer 11 extends over the surfaces including the wall surfaces of the cavity in the deposition masking layer 5, the deposition masking is protected from attack by the plating electrolyte, and there is no degradation of the deposition masking layer 5 during the plating step, enabling to fabricate a deposit of well defined shape, thereby avoiding the serious problems of producing devices deviating from the specification which can occur in the conventional technique.

Further, in the step of removing the conductive layers 11 and 12, because the removal objects are all within the line-of-sight, all the materials can be removed without the fear of leaving some residual conductive materials in the shadow of the ion milling beams. Therefore it becomes possible to closely space the circuit means without the fear of possible shorting problems caused by the conducting residues in the fabrication processing, thereby achieving highly packed IC devices to be manufactured. The process also makes it possible to avoid causing damages to the substrate material 1, by prolonged ion milling step.

Further, in the conventional processing, in order to toughen the photoresist layer against attack by the electrolyte, the masking layer is subjected to baking at elevated temperatures. This processing step often causes distortion of the photoresist shape, thus destroying the carefully fabricated component profile. In this invention, there is no need to bake deposition masking layer 5, because a rigid shaped polyimide film is used for this masking. The edge profile definitions can be retained sharp, because there is no plating solution attack on the film, and therefore designed specification performance can be closely duplicated.

Further, even if the surface of the sublayer containing such components as air bridges is not level, the height of the sidewall plating is determined by the thickness of the polyimide film, and therefore, the depth of the deposit can be increased relatively easily by increasing the polyimide film thickness.

Further, since the surface of the insulation layer made of polyimide film is flat, there is no need for special planarization masking step before fabricating other active circuit means after completing the line patterns on the substrate material.

Further and ultimately, the process of fabricating the circuit according to the first embodiment, because the final processing step involves only the dissolution removal of the deposition masking layer 5, it becomes possible to produce much more closely spaced circuit means 15A and 15B than in the case of conventional fabrication technique, which requires the final step of ion milling to remove metallic layers.

A second embodiment will be presented with reference to FIGS. 3 (a) to (e).

In this embodiment, the same steps as in the first embodiment are referred to by the same numeral, and detailed explanations are omitted.

The processing steps involved in the embodiment are as follows.

It is possible to fabricate a structure shown in FIG. 3 (e) by application of the sidewall plating technique by starting with the structure shown in FIG. 2 (e).

In the next step, on the top surface of the conductive deposit 12, a deposition masking layer 5' is formed, -having window patterns 6A' and 6B' which are the same window patterns as the window 6A and 6B of the deposition masking layer 5, to produce a structure illustrated in FIG. 3 (b).

Next, a conductive layer 11' is formed (by the same technique as for the conductive layer 11) extending continually over the windows 6A' and 6B', including their wall surfaces, of the deposition masking layer 5' and over the windows 6A' and 6B' of the deposition masking layer 5' of a conductive deposit 12, to produce a structure illustrated in FIG. 3 (c).

Next, on the top surface of the conductive layer 11', the conductive deposit 12' is deposited, using the same technique as for the conductive layer 12, utilizing the conductive layer 11' as a plating electrode, so as to fill the cavity of the N&D configuration of the windows 6A' and 6B' of the deposition masking layer 5', to produce a stacked structure illustrated in FIG. 3 (d).

Next, the removal steps presented in FIGS. 2 (f) and (g) are repeated twice, thereby forming circuit means 15A', having a lower element consisting of the conductive layer 11 and the deposit 12; and an upper element consisting of the conductive layers 11' and the deposit 12', and bridging the circuit means 2 over the insulation 10, and a neighboring circuit means 15B', having a lower element consisting of the conductive layer and a lower element consisting of the conductive layer 11 and the deposit 12; and an upper element consisting of the conductive layers 11' and the deposit 12', connecting to the circuit means 2, as shown in FIG. 3 (e).

The above processing step completes the description of the embodiment.

According to the embodiment, the initial processing steps are the same as in the first embodiment, which are followed further by the additional steps shown in FIGS. 3 (b) to (e). The beneficial features are the same as in the first embodiment, but this embodiment provides an additional benefit of much thicker conductive line circuit means 15A' and 15B' having a thickness over twice that of the circuit means 15A and 15B of the first embodiment.

A third preferred embodiment will be presented with reference to FIGS. 4 (a) to (d).

In this embodiment, the same steps shown in the first embodiment to step (e) are followed, and are referred to by the same numerals, and detailed explanations are omitted.

The embodiment shown in FIGS. 4 (a) to (d) involves the following processing steps.

The processing steps identical to those shown up to FIG. 2 (e) are followed to produce the structure shown in FIG. 4 (a).

In the next step, on the top surface of the conductive deposit 12, a masking layer 16, made of a photoresist for example, is formed so as to mask the regions corresponding to windows 6A and 6B of the deposition masking layer 5, to produce a structure illustrated in FIG. 4 (b).

Next, the deposit and the conductive layer 11 are removed by utilizing a removal technique applicable to removing metallic materials, to produce a structure illustrated in FIG. 4 (c).

Then, by removing the masking layers 3 and 5, two circuit means are produced: the conductive layer 15A", consisting of the conductive layer 11 and the deposit 12 on the insulation 10; and 15B", consisting of the conductive layer 11' and the deposit 12, connected to the circuit means 2, as illustrated in FIG. 4 (d).

The above step completes the description of the third embodiment.

According to the processing steps presented in the third embodiment, with the exception of utilization of the removal step of the masking layer 16 for the conductive layers 11 and 12, the steps are identical to those shown in the first embodiment. It is evident, without detailed explanations, that the same advantages as in the previous embodiments accrue, and additionally, by adopting the masking layer 16 for the conductive layers 11 and 12, it becomes possible to fabricate the desired planar shapes in the circuit means 15A" and 15B", as compared with the first embodiment, thereby permitting to produce circuit means 15A" and 15B" having a lower circuit resistance than that achieved by the first embodiment.

A variation embodiment of the third embodiment can be fabricated as shown in FIG. 5 (a) to (d). This example is concerned with the application of the basic sidewall plating technique to the fabrication of a line conductor element having a special profile shape, such as the one illustrated in FIG. 5 (d). Starting from the structure fabricated in step (e) of the example, a photomasking layer 16 is formed directly above and extending beyond the window to a required distance, so as to provide milling masking to fabricate structure shown in FIG. 5 (c). By removing the masking layer 16, a pair of inverted L shaped (termed invL) elements is produced, one with and one without an air bridge, as shown in FIG. 5 (d).

Another example can be fabricated as in FIG. 6 (a) to (d) to produce a profile of a T-shape, by following the steps essentially the same as in the previous variations.

A fourth preferred embodiment will be presented with reference to FIGS. 7 (a) to (f).

The processing steps involved in the example are as follows.

On the surface of the substrate material 1 are formed a deposition masking layer 5" having windows 6" to correspond with the deposition masking layer 5 in the first embodiment, as shown in FIG. 7 (a).

Next, the conductive layer 11 is formed on the surface of the deposition masking layer 5" including the wall surfaces of the window 6" to produce a structure illustrated in FIG. 7 (b).

Next, a conductive deposit 12", to correspond with the conductive deposit 12 of FIG. 5, is deposited on top of and to extend along, but not to fill, the cavity surface of the conductive layer 11, to produce a structure illustrated in FIG. 7 (c).

In the next step, on the top surface of the conductive deposit 12", a masking layer 16', made of a photoresist for example, is formed so as to mask the regions corresponding to the window 6", to produce a structure illustrated in FIG. 7 (d).

Next, by removing the conductive layer 11 and 12" (by such technique as ion milling) for the conductive layers 11 and 12" so as to leave the conductive layers 13 and 14" over the regions of the window 6" of the deposition masking layer 5" to produce a structure illustrated in FIG. 7 (e).

Next, the masking layers 5" and 16' are removed (by such technique as dissolution) from the respective substrate material 1 and the circuit means 15", thereby fabricating the circuit means 15" consisting of the conductive layer 11 and the deposit 12", to produce a structure illustrated in FIG. 7 (f).

The above step completes the description of the fourth embodiment.

According to the embodiment, in addition to accruing the same advantages as described previously for the N&D configuration conductors, the cross sectional shape of a line conductor shown in FIG. 7 (f) is useful for signal transmission as well as for forming air bridge structures of high loading capacity, which will be explained later. It can be seen without presenting further details that the same advantages as presented in the first embodiment will be realized.

A fifth embodiment will be presented with reference to FIGS. 8 (a) to (g).

This embodiment illustrates an air bridge structure circuit means connecting the two circuit means and bridging over a third circuit means formed on a common substrate material. Such an architecture can be achieved by the processing steps involved in the embodiment described below.

First, three circuit means 21A, 21B and 21C are formed on a substrate material 1 so that the circuit means 21C is disposed in between the circuit means 21A and 21B, to produce a structure illustrated in FIG. 8 (a).

Next, a deposition masking layer 22 having windows 23A and 23B is formed on the substrate material 1 on the outer regions of the circuit means 21A and 21B, to produce a structure illustrated in FIG. 8 (b).

Next, a conductive layer 24 is formed extending continually over on the surfaces exposed by the windows 23A and 23B, including the cavity wall surfaces, of the masking layer 22, and on the surfaces over the window regions 23A and 23B of the masking layer 22 for the circuit means 21A and 21B, to produce a structure illustrated in FIG. 8 (c).

Next, on top of the conductive layer 24 is deposited a conductive deposit 24, by electroplating using the conductive layer 24 as the plating electrode, so as to fill the windows 23A and 23B of the masking layer 22, to produce a structure illustrated in FIG. 8 (d).

Next, on top of the conductive layer 25 is formed a masking layer 26, made of a photoresist for example, for forming a masking strip starting from window region 23A and crossing over to the window region 23B to produce a structure illustrated in FIG. 8 (e).

Next, by using the masking layer 26 for the conductive layers 24 and 25, removal step is performed to form a new conductor 29 consisting of the conductive layer 24 and 25, and to form a bridging conductive layer 29 over the circuit means 21C, to produce a structure illustrated in FIG. 8 (f).

Next, using the removal step (dissolution for example) for the masking layers 22 and 26, an air space 30 is formed between the circuit means 21C and the bridging conductive layer 29, consisting of the conductors 27, 28, to produce a structure illustrated in FIG. 8 (g).

The above step completes the description of the fifth embodiment.

According to the embodiment, in addition to all the features presented in the first embodiment, a bridging structure is obtained connecting the conductive layers 21A and 21B by means of a bridging conductive layer 29 consisting of conductive layers 24 and 25. In this case, the bridging structure is formed by the process of electroplating, thereby enabling the air bridge formation in one step. This processing technique permits a combination of forming circuit means having a N&D configuration and low circuit resistance to connect two circuits.

The embodiments presented above illustrate only a limited number of cases of applications of the sidewall plating technique. Many other variations would be possible without diverting from the essential features of the sidewall plating technique. One unique embodiment which can be fabricated by the sidewall plating technique is illustrated in FIG. 9.

In some cases, it is necessary to provide circuit means shaped as shown in FIG. 9 (o). Such a configuration is useful in providing a conductor of low resistance by providing a large cross sectional area for signal conduction, and to reduce parasitic interactions because of the small contact area at the base. The sidewall plating technique is ideally suited to forming such a structure and the steps are illustrated in FIGS. 9 (a) to (o).

On a polyimide film, a narrow groove of a square cross sectional shape is fabricated by the usual technique of masking with photoresist (a) and dry oxygen etching (b) to produce a structure illustrated in FIG. 9 (c).

By repeating the steps (a) and (b), a structure illustrated in FIG. 9 (f) is produced. By repeating the basic steps, masking (a) and dry etching (b) several times the opening size and the number of steps can be gradually increased to ultimately produce a structure illustrated in FIG. 9 (j). When the required number of steps have been formed, the sidewall plating technique is applied as illustrated in FIGS. 9 (l) and (o) to carry out the processing steps of: forming a conductive layer to be used as an electrode in electroplating, depositing a conductive deposit into the stepped cavity, masking appropriate, etching and removing the masking layer, a conductive stepped configuration channel conductor shown in FIG. 9 (o) is fabricated.

POLYIMIDE INSULATION FOR CIRCUIT FORMATION BY SIDEWALL PLATING TECHNIQUE

Background of the Invention

Conventionally, wet etching techniques based on hydrazine group substances and photographic developing techniques have been known. However, because of the problems of low precision pattern definition produced by wet fabrication techniques, dry etching techniques utilizing gaseous oxygen have been introduced in recent years. However, the choice of photoresist material for the oxygen dry etching process is limited. For this reason, it has not been possible to fabricate precision circuit patterns having sufficient depth, which would be required if circuit patterns suitable for a three dimensional IC architecture are to be realized.

The sidewall plating technique demands a deposition masking to form a deep cavity of well defined profile, as described in the previous section, and such a structure cannot be produced by the known wet processing or by the known combination of the existing dry etching steps. The process of fabricating deep windows by polyimide film permits fabricating N& configuration conductors for microwave signal transmission, which can provide a high circuit packing density and low parasitic interferences.

Summary of the Invention

An object of the present invention is to present a fabrication process for polyimide materials, which would enable precision fabrication of circuit patterns having a window cavity of a selected depth.

The invented process basically consists of a two step dry etching of polyimide film with the use of another masking layer such as $SiO_2$, SiN and SiON (or WSi and WSiN) between the polyimide film and the photoresist layer which resists attack by dry oxygen but is etched by a halogenous gas, such as $CF_4$, $C_2F_6$, $CHF_3$ and $SF_6$ thereby affording protection of the polyimide layer while it is being etched by dry oxygen, thereby permitting precision fabrication of circuit patterns of deep window cavity. The use of WSi type of material presents no additional processing problems, since this layer can be removed along with the gold layer and deposit by ion milling. In other circuit designs, $SiO_2$ is used because it is resistant to oxygen dry etching, and it can be used advantageously in a multilayer devices.

Forming of a conductive circuit is carried out without removing the second masking layer so as to fill the spaces produced in the polyimide in the previous fabrication steps with a conductive material. The top surface is levelled off, followed by a step of removing those regions of the conductive deposit and the masking layer which are not required for the device, thereby forming circuit means, having a narrow and deep (N&D configuration) cross sectional shape, for transmitting microwave signals.

Preferred Embodiments

A first preferred embodiment will be explained with reference to FIGS. 10 (a) to (h) which illustrate the steps involved in fabricating window cavities having a N&D configuration required in applying the sidewall plating technique.

In step (a), on an insulating substrate 1, a polyimide masking film 5 is applied to which a film masking layer 103 is attached, to produce a structure illustrated in FIG. 10 (a). This film masking layer 103 is made of a material which cannot be etched by a dry etching process using oxygen but can be etched by a dry etching process using a halogenous gas;

In step (b), a photoresist layer 104 is formed next on top of the masking layer 103, and a circuit pattern is fabricated by photolithography, to produce a structure illustrated in FIG. 10 (b).

In step (c), the masking layer 103 is dry etched with a halogenous gas to produce a circuit pattern according to the window patterns formed in the above step, to produce a structure illustrated in FIG. 10 (c)

In step (d), the photoresist layer 104 is removed, as illustrated in FIG. 10 (d), with an organic solvent, followed the next step.

In step (e) the polyimide film 5 is etched and removed by dry etching with a halogenous gas to form a window cavity of a N&D configuration shown in FIG. 10 (e). In some cases, step (d) can be skipped by performing dry etching of the polyimide 5 without removing the photoresist layer 104.

In some cases, it may be necessary to fabricate patterns in the masking layer 103. In this case, extra steps after the step (e), the steps illustrated in FIGS. 10 (f) and (h), may be carried out as follows:

(f) another planarization photoresist layer 105 is formed on top of the masking layer 103 as shown in FIG. 10 (f).

In step (g), a circuit pattern is formed on the masking layer 103 on those regions which are exposed by the photomask 105

In step (h), the photoresist left in the window cavity of polyimide 5 is dissolved with an organic solvent to form the section shown in FIG. 10 (h).

The steps (f) and (g) are not always necessary, and in such cases, it is permissible to proceed directly to step (h) from step (e), which just involves a step of removing the second masking layer 103.

The film masking layer 103, or the first masking layer 103 is usually selected from silicon compounds such as $SiO_2$, SiN and SiON in combination with an etching halogenous gas, such as $CF_4$, $C_2F_6$, $CHF_3$ and $SF_6$.

The first masking layer 103, which cannot be affected by oxygen etching, can also be tungsten or tungsten compounds such a WSi and WSiN in combination with a halogenous gas selected from $CF_4$, $C_2F_6$, $CHF_3$, and $SF_6$.

According to this embodiment, it is possible to form window cavities having a N&D configuration having sharp definitions in the polyimide film 5.

A second embodiment will be explained with reference to FIG. 11 (a) through to (f), which are undertaken after the step shown in FIG. 10 (e), with the masking layer 103 remaining on the polyimide 5. The fabrication process consists of the steps of:

(a) forming a first conductive layer 11 by means, such as sputtering, so as to form the first conductive layer 11 uniformly throughout the window cavity, including the sidewalls as illustrated in FIG. 11 (a).

(b) depositing a second conductive metal 12, such as gold in the window cavity, by depositing means such as electroplating, so as to completely fill the window cavity utilizing the layer 11 as an electrode in a plating process. The top surface is made planar by the influence of the flat first conductive metal layer 11, as shown in FIG. 11 (b).

(c) removing the metal deposit 12 (gold), the first conductive layer 11 and the masking layer 103 by utilizing such removal means as ion milling from everywhere on the surface of polyimide except from the window region to form a section shown in FIG. 11 (c).

With the above steps, only the window region can be fabricated. When it is necessary to fabricate other components on the IC or to connect different circuit means, by such techniques as line junctions, via holes or through holes, the additional steps 10 (d) to (f) can be carried out to form a section shown in FIG. 11 (f).

(d) After the step (b) above, the conductive deposit 12 is coated with a photoresist circuit pattern masking layer 16, and the required circuit patterning is carried out by photo-lithography to produce a section shown in FIG. 11 (d).

(e) Ion milling, as in step (c) above, is carried out according to the patterns on the photoresist masking layer 16 to remove unnecessary portions of the conductive deposit 12, the first conductive layer 11 and the masking layer 103 to produce a section shown in FIG. 11 (e).

(f) The photoresist masking layer 16 is dissolved with a suitable solution to produce the section shown in FIG. 11 (f).

In FIG. 11 (f), it should be noted that the direction of the signal passage, exceptionally in this particular case, is in the left/right direction of the conductor 12.

In IC fabrication, it is often necessary to produce a conductor junction having a particular geometrical shape. Two such examples are an inverted L, termed invL configuration, and a T-configuration, respectively. The technique of the present invention is applicable to producing such junction shapes by the steps illustrated in FIGS. 12 (a), (b) and (c), and in FIG. 13 (a), (b) and (c), respectively, for the invL and the T configurations.

Figure 12A:
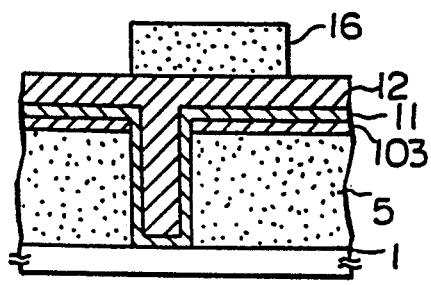
FIGS. 12a-12c illustrate the steps for fabricating an invL shaped conductor surrounded with insulating sections.
Figure 12B:
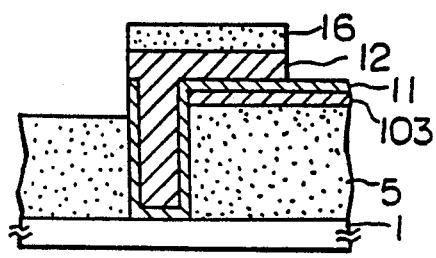
Figure 12C:
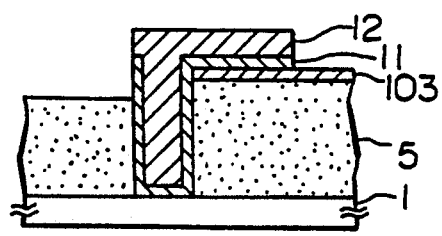

After the step (d) shown in FIG. 11 (d), a photoresist masking layer 16 of a given dimension is formed on the conductive deposit 12 as shown in FIG. 12 (a). This step is followed by ion milling as before to remove the metallic materials, according to the junction patterns on the photoresist masking layer 16, thereby removing unnecessary portions of the conductive deposit 12, the first conductive layer 11 and the masking layer 103 to produce a section shown in FIG. 12 (b). The photoresist masking layer 16 is dissolved to produce the invL configuration shown in FIG. 12 (c).

Figure 13A:
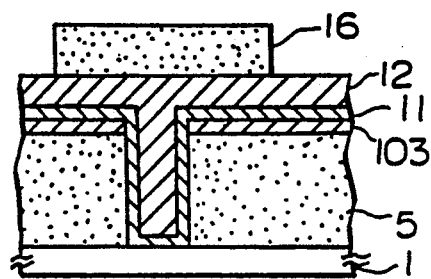
FIGS. 13a-13c illustrate the steps for fabricating a T shaped conductor surrounded with insulating sections.
Figure 13B:
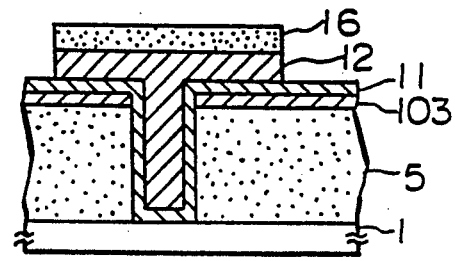
Figure 13C:
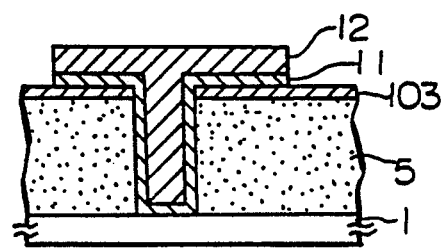
Figure 14A:
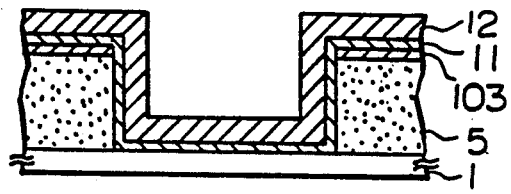
FIGS. 14a-14d illustrate the steps for fabricating a U-shaped channel conductor of a wide opening.
Figure 14B:
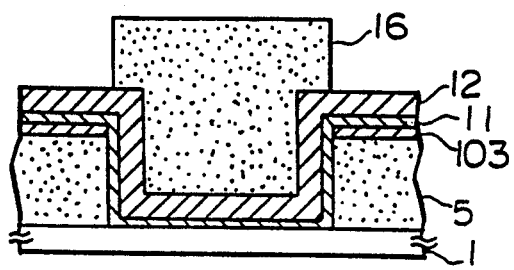
Figure 14C:
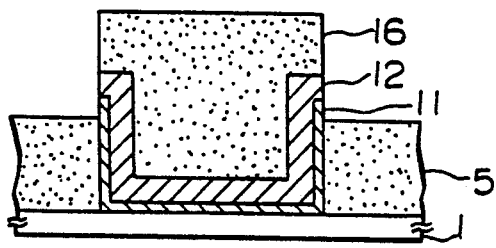
Figure 14D:
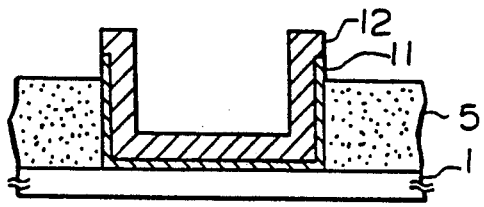

The same basic processing steps in fabricating the invL configuration, allowing for the different position and extent of photoresist masking layer 16, are applied to produce the T configuration shown in FIG. 13 (c).

In some cases, it is necessary to produce window spaces having a wide opening. However the processing steps shown so far are applicable only to the fabrication of windows having a relatively narrow width (i.e. N&D configuration). The present invention is applicable to the fabrication of wide channel type conductors illustrated in FIGS. 14 (a). The steps of completing this fabrication process will be explained below in FIGS. 14 (a) to (d).

A polyimide film having a window cavity of a wide window opening is provided initially by the steps described earlier in FIG. 7 (a). The processing steps to FIG. 11 (a) are repeated, and the fabrication steps will be described below starting from FIGS. 14 (a) which is similar to step shown in FIG. 11 (b).

(a) In the step of depositing the conductive metal deposit 12 on top of the first conductive metal layer 11, the depositing process is not aimed at filling the window cavity but is aimed at forming a uniform layer of deposit in the cavity surfaces to produce a section shown in FIG. 14 (a).

(b) The photoresist masking layer is formed on the deposit 12 so as to cover the wide window cavity and to reach the required height, as shown in FIG. 14 (b).

(c) The metal deposit 12 (gold), the first conductive layer 11 and the masking layer 103 are removed by such removal means as ion milling from the surface of polyimide to form a section shown in FIG. 14 (c).

(d) The photoresist masking layer 16 is removed t produce the section having a wide window opening width shown in FIG. 14 (d).

The structure shown in FIG. 14 (d) has edge regions consisting of vertical walls of N&D configuration. In transmitting high frequency signals, which tend to concentrate near the skin and the edge regions of a conductor, such a structure can be utilized effectively to reduce circuit resistance.

It should also be noted that the first conductive layer 11, if gold, does not always adhere very well to polyimide substrate. In such a case, a sublayer composed of tungsten or tungsten alloys can be used together with but before the gold conductive layer to increase the adhesion of the conductive layer 11 to polyimide.

Further variation of the invented process is possible when the window space is relatively small, by substituting the conductive layer process, such as sputtering in place of the deposition process, such as electroplating, to fill in the window space. In this case, the conductive layer can be made of either tungsten or gold.

It should be noted that the resolution of window masking pattern and the circuit patterns using such window spaces is limited by the resolution ability of the photoresist masking layer.

APPLICATION OF SIDEWALL PLATING TECHNIQUE TO FABRICATION OF SIGNAL TRANSMISSION LINES

Background of the Invention

The techniques for transmitting microwave signals in hybrid IC are known as microstrip (MS) lines, coplanar strips (CS) and slot lines (SL), shown for example in "Design Considerations for Monolithic Microwave Circuits", by Robert A. Pucel, published in IEEE transactions on Microwave Theory and Techniques, vol. MTT-29, page 53, No. 6, June, 1981. These wide and flat transmission lines are constructed from electroplated metal conductors of a uniform thickness.

In the conventional circuit designs for microwave transmissions, signal loss is caused by two effects: signal loss caused by signal localization effects and by a phenomenon known as the skin effect. The localization effect is caused by the localization of signal in the surface regions of a signal conductor, closest to the ground line near the skin of a conductor. Such signal concentration produces an effect of forcing the signal to flow in a limited surface area of a conductor, thereby increasing the d.c. circuit resistance and contributing to loss of signal transmission efficiency. In addition, the skin effects become particularly severe, at microwave frequencies, and contribute greatly to signal loss in IC devices.

Because of such signal localization effects, the attempt to lower the circuit resistance simply by increasing the width of the conductors in the conventional MS, CP and SL transmission configurations results in little beneficial effects as explained below.

In the conventional transmission line designs, the cross sectional shape of the line conductor, viewed in the direction of signal passage, is basically a wide and flat strip (10 $\mu$m width by 1 to 2 $\mu$m depth), termed W&F conductors. In the MS configuration using such W&F conductors, in which the strip conductors face each other across an insulating substrate material, a surface effect is produced in which the signal concentrates in a portion of the surface which is near the substrate. The attempt to lower the circuit resistance by increasing the conductor area required widening the strip width even further to distribute the signal over a large area, but such a remedy works counter to achieving a high density circuit packing called for in modern IC designs. Therefore, there is an upper limit to which the width of a signal conductor can be increased to lower the circuit resistance.

In CP and SL designs, the thickness of the signal conductor can be increased to offset the resistance increase caused by the signal localization effect. This can be achieved by prolonging the time of electroplating so as to form a thicker deposit on the substrate material. However, this approach causes fabrication problems as described in detail under the section on sidewall plating technique (destruction of the sharp profile of the masking layer), leading to high scrap rate and a general loss of productivity.

Furthermore, in the CP and SL configurations, it is only necessary to increase the areas of the edge regions of a conductor adjoining the ground line. However, the attempt to increase the thickness of a strip conductor by the conventional plating methodology results inevitably in depositing metals in the central region of the conductor as well.

Summary of the Invention

The object of the present invention is to present a solution to such problems inherent in the conventional structures of the microwave signal transmission lines.

According to one aspect of the present invention, the signal loss caused by high end resistivity can be solved by having transmission lines in which the regions of the conductor which tend to collect signals are enlarged so as to increase the effective area critical to the transmission of signals.

Another aspect of the invention involves plating gold on the surface regions of the transmission lines susceptible to collecting the signal. This approach is more cost effective than plating gold over all the surfaces of the transmission lines. Such gold plated lines can be made smaller and still have low circuit resistance, thus contributing effectively to increasing the circuit packing density and miniaturization of the device.

According to another aspect of the invention, inductive circuits made from such transmission lines can also be miniaturized and employed to fabricate bandpass filters in IC devices.

Preferred Embodiments

Figure 15:
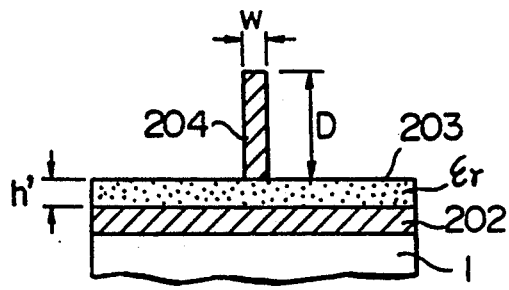
FIG. 15 is a microstrip configuration transmission line fabricated according to the sidewall plating technique.

FIG. 15 shows an embodiment of a MS configuration in which the signal transmission line of the conventional strip shape has been placed vertically on its thin edge, instead of being laid flat as in the conventional circuitry. This configuration can be readily fabricated by the technique of the present invention. The conductor 204 of the present invention has a depth D which is which is much larger than the width W, creating a vertical strip configuration referred to as narrow and deep (N&D) configuration. It is laid on its edge on the top surface of an insulator 203 of a dielectric constant $\epsilon_r$, and the insulator is laid on a ground conductor 202 which is disposed directly on top of an insulating substrate material 1. In such a configuration, the resistance of the line is about the same as in the conventional flat laid conductor, if the surface effects are ignored for now, but the area occupied by the conductors has been greatly reduced.

Figure 16:
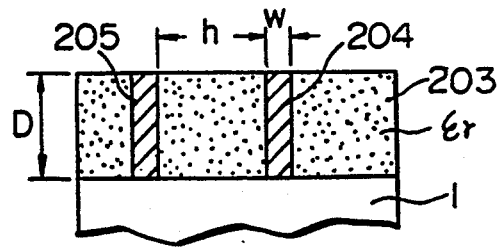
FIG. 16 is a slot line configuration transmission line having solid insulators, fabricated according to the sidewall plating technique.

FIG. 16 is another embodiment, a SL configuration, which can be readily fabricated. The ground line 205 as well as the signal line 204 are made in the N&D configuration separated by a separation distance h and having an intervening insulating layer 203. Such a configuration permits placement of other adjacent transmission lines to the right of the conductor 204 away from the ground line 205. This is because the signal is largely concentrated on the left side surface of the line 204, and the right side surface of the line 204 does not present much problems caused by the interference effects of the signal line 204. Therefore, this configuration permits high density transmission line packing.

Figure 17:
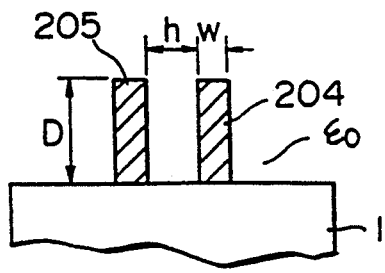
FIG. 17 is a variation of the transmission line shown in FIG. 16 with air insulation substituting for solid insulation.

In an embodiment of a similar configuration, shown in FIG. 17 fabricated by the sidewall plating technique, the separation distance h can be decreased further by replacing the insulation material 203 with air, because of the increase in the dielectric constant, thereby contributing further to packing density and miniaturization of the IC device.

Figure 18:
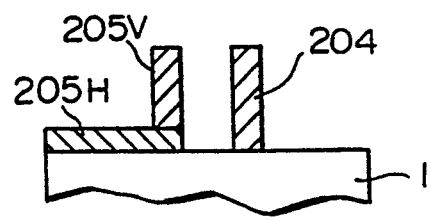
FIG. 18 is a variation, of the example shown in FIG. 17, which lowers the circuit resistance by providing a vertical side conductor fabricated according to the sidewall plating technique.

In the configurations shown in FIGS. 16 and 17, the size of the ground line can be restricted in comparison to the traditional horizontal strip configuration. In order to decrease the resistance of the ground line, an additional horizontal strip 205H parallel to the substrate material 1 may be added as shown in an embodiment FIG. 18.

Figure 19:
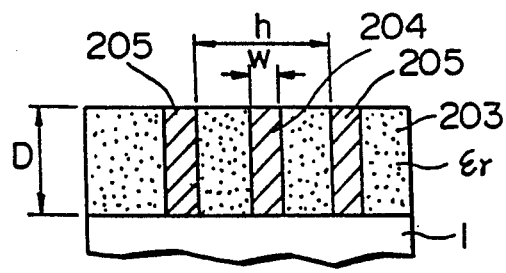
FIG. 19 is a coplanar configuration transmission line having solid insulators, fabricated according to the sidewall plating technique.

FIG. 19 is another embodiment in which the conventional CP configuration is made into a N&D configuration of the present invention. The ground line 205 is separated by a separation distance h. The signal line 204 is surrounded by two separated ground lines 205. As in the previous case, the packing density can be increased, the size of the device miniaturized and additional signal lines can be added in between the exiting signal line and the ground line without causing problems of interference.

Figure 20:
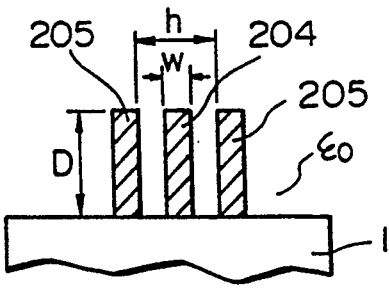
FIG. 20 is a variation, of the example shown in FIG. 19, with air insulation substituting for solid insulation.

FIG. 20 shows an embodiment in which the insulation material 203 of the embodiment in FIG. 19 is replaced with air, thereby permitting a decrease in the separation distance h, in accordance with the lowering in the dielectric constant δ of air which permit the electrodes to be spaced closer than in the case of solid dielectric material so as to permit an increase in the packing density. In the case illustrated in FIG. 28, the ground line and the signal lines are provided with a number of vertical components, thereby increasing the effective area of signal transmission, thus leading to a decrease in the circuit resistance.

Figure 21:
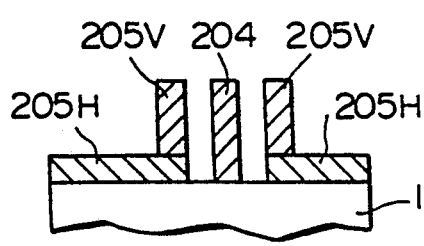
FIG. 21 is a variation of the example shown in FIG. 20, which lowers the circuit resistance by providing a vertical side conductor fabricated according to the sidewall plating technique.

In order to decrease the resistance of the ground line, an additional strip 205H parallel to the substrate material 1 can be added, as shown in an embodiment shown in FIG. 21, to the embodiment shown in FIG. 20.

Figure 22:
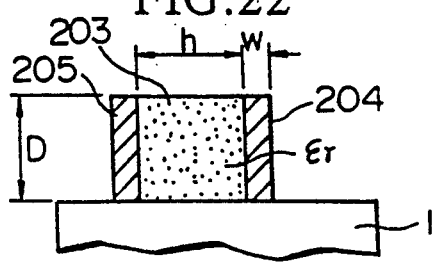
FIG. 22 is a slot line configuration transmission line with a solid insulator, fabricated according the sidewall plating technique.
Figure 23:
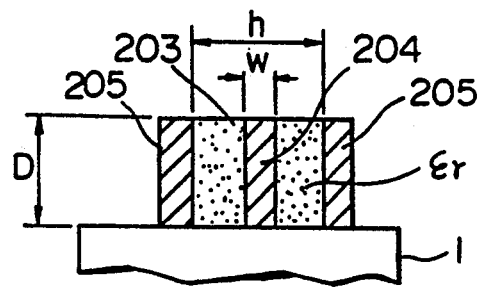
FIG. 23 is a variation of the transmission line shown in FIG. 20 having outside insulations removed.

A modification to the configuration shown in FIG. 16 is to remove the outside insulation materials so as to leave only the central insulation material 203, as shown in an embodiment shown in FIG. 22 to increase the flexibility of adding circuits to the surrounding regions. Similarly, the configuration shown in FIG. 19 can be modified to an embodiment shown in FIG. 23.

Figure 24:
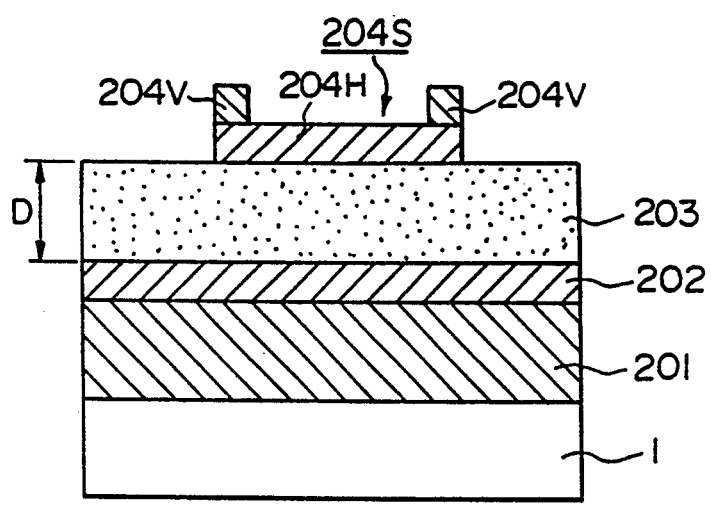
FIG. 24 is an application of sidewall plating technique to the conventional coplanar configuration transmission line to lower the circuit resistance.

FIG. 24 shows an improved embodiment of the conventional MS configuration, produced according to the technique of the present invention, in which the signal line 204S comprises additional vertical line elements 204V in addition to the horizontal flat line elements 204H present in the conventional MS configuration. Such a transmission line in the conventional device would have a lower circuit resistance because of the increased area for signal conduction in the skin regions. The vertical elements 204V are made of gold plating.

Preferred Embodiments

Figure 25:
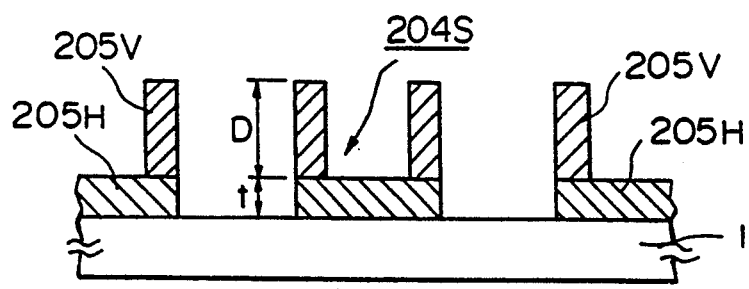
FIG. 25 is an application of the sidewall plating technique to the conventional coplanar configuration transmission line to lower the circuit resistance.

FIG. 25 shows an embodiment, a completed N&D circuit means of the N&D configuration of the CP type, produced by the steps according to the present invention.

The fabrication steps involved in a preferred embodiment will be explained in reference to FIG. 25.

Numeral 1 refers to an insulating substrate material upon which is fabricated a central signal conductive line 204S comprising vertical and horizontal signal line elements serving as conductors for transmitting signals. The ground lines also comprise vertical and horizontal line elements, 205V and 205H, respectively. In these cases, by having the vertical line elements, the signal localization effects on the edge surfaces of the line conductors are reduced, thereby reducing the circuit resistance and improving the signal transmission capability. The vertical line elements are made of gold plating.

The embodiment shown in FIG. 25 is the CP configuration, but the basic technique can equally be applied to MS and SL configurations.

Figure 26:
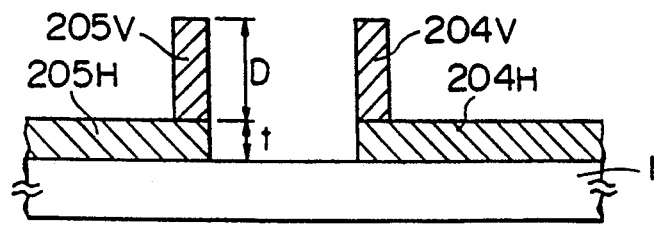
FIG. 26 is an application of the sidewall plating technique to the conventional slot line configuration transmission line to lower the circuit resistance.

An embodiment showing a N&D configuration of a SL type according to the present invention is presented in FIG. 26. The same combination of vertical and horizontal line elements, 205V and 205H, comprise the two line elements in the SL type arrangement. This N&D configuration has the same advantages, as in the foregoing examples, of reducing the circuit resistivity and increasing the packing density, leading to overall improvement in the efficiency of signal transmission.

Figure 27:
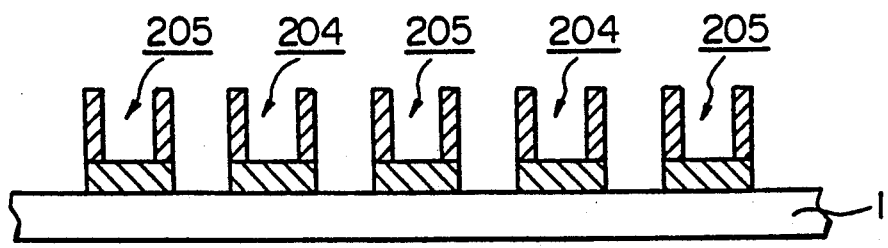
FIG. 27 is an application of the sidewall plating technique to increase the circuit packing density.
Figure 28:
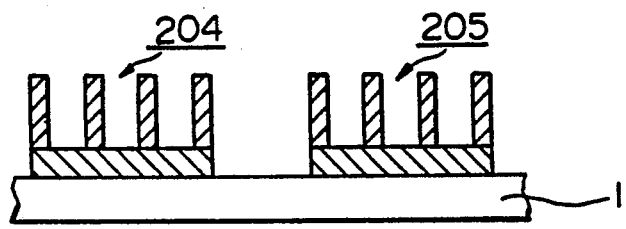
FIG. 28 is a further example of lowering the circuit resistance by providing a large surface area for signal passage in the sidewalls.

Other embodiment variations of the basic configuration comprising vertical and horizontal line elements are shown in FIG. 27, in which a plurality of vertical line elements 205V are disposed in parallel on the horizontal line element 205H so as to enable fabrication of additional circuit means in the spaces bounded by the vertical line elements 205V. This configuration reduces the circuit resistance caused by the skin effect even further by increasing the signal conductor area brought about by the addition of several more vertical line elements. An embodiment of a variation of the embodiment shown in FIG. 27 is shown in FIG. 28.

Figure 29A:
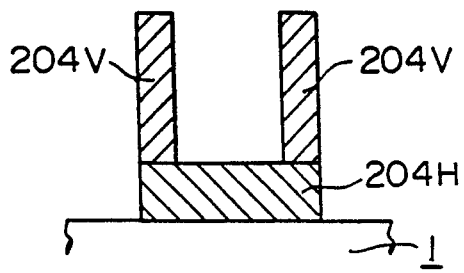
FIGS. 29a and 29b illustrate a one-step fabrication of a channel shape conductor.
Figure 29B:
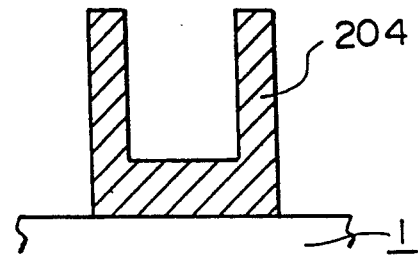

In these illustrations, U-shaped channel conductors are frequently used. FIGS. 29 (a) and (b) illustrate an example of one step fabrication of a U-shaped channel conductor. It is not necessary that such a shape be produced in two steps of forming a horizontal conductor first followed by the deposition of a pair of vertical conductors.

Figure 30:
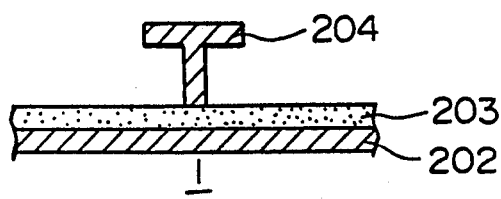
FIG. 30 is an example of a microstrip configuration transmission line having a T-shaped conductor.
Figure 31:
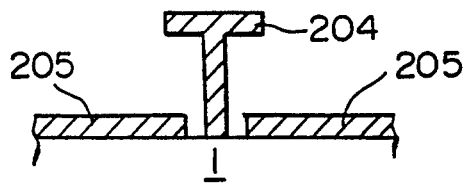
FIG. 31 is an example of a coplanar configuration transmission line having a T-shaped conductor.

In FIGS. 30 and 31, variation examples in the conductor shape are illustrated. In both the MS and the CP configurations, it is possible to shape the conductor in a T-shape so as to provide increased area for device fabrication on the transmission line, as well as to provide opportunities to increase packing density.

In the descriptions presented above, a signal line has been described in terms of the vertical and horizontal line elements so as to relate to and contrast with the conventional line configurations. However, it should be noted that in the manufacturing the U-shaped N&D configuration of the present invention, the step of depositing conducting material 204 of the vertical and horizontal line elements can be carried out in one step simultaneously as was illustrated in FIG. 29 (b).

Embodiments of the U-shaped channel conductors to fabrication of inductive elements will be illustrated next in reference to FIGS. 32 (a) and (b), as a direct example of applying the configuration of FIG. 27 to the fabrication of an inductor. Other inductors will be presented in more detail in a later section.

FIG. 32 (a) presents a plan view of a spiral inductor fabricated by a combination of horizontal line elements 204H and vertical line elements 204V formed on a substrate material 1. The vertical line elements 204V are in the N&D configuration, as in the previous examples, and are made of gold plating. According to such a design, even if the size of the inductor is decreased to make it compact the circuit resistance would not increase, leading to continued opportunities for circuit miniaturization.

Further, by using low resistivity, miniaturized inductor elements according to the present invention, the conventional bandpass filters which could not be made monolithic because of their large size could be now be integrated into an IC.

In the embodiments presented above, the experiments to date indicate tentatively that the geometry of the line elements should have the following dimensional relationships for optimum performance:

for MS configuration; $D \leq 2t$,
for CP configuration; $D \geq 2t$ and
for spiral configuration; $D >> t$, where D is the depth of the vertical line element and t is the thickness of the horizontal line element.

Figure 33A:
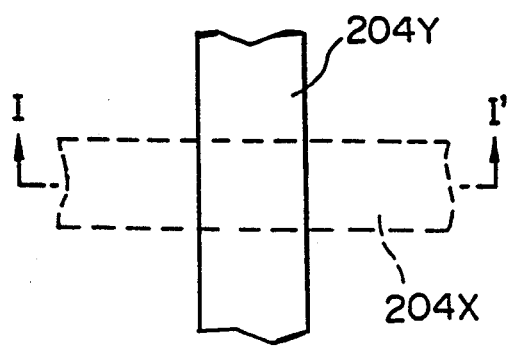
FIGS. 33a and 33b show an example of a crossing of a conductor in a microstrip configuration.
Figure 33B:
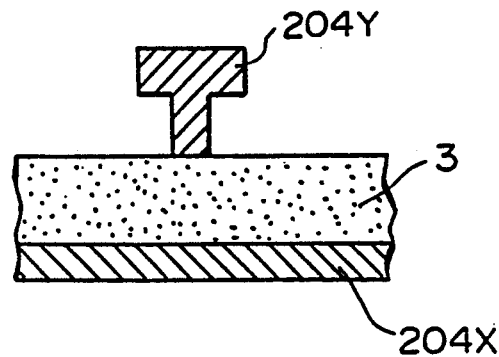
Figure 34A:
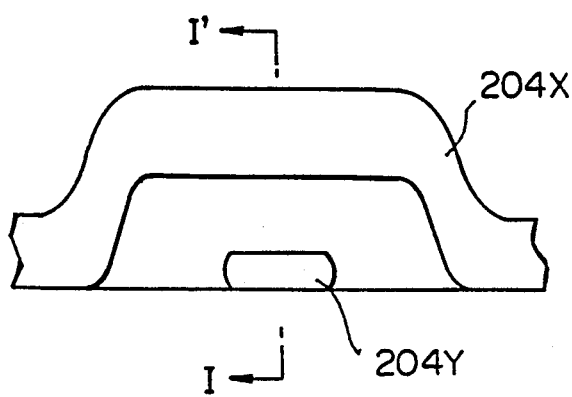
FIGS. 34a-34d show an application of the sidewall plating technique to fabrication of air bridge structures.
Figure 34B:
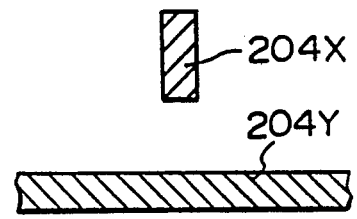
Figure 34C:
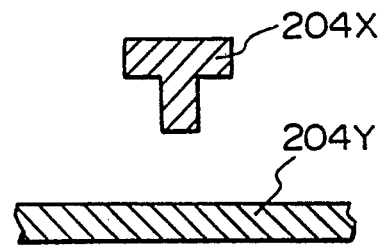
Figure 34D:
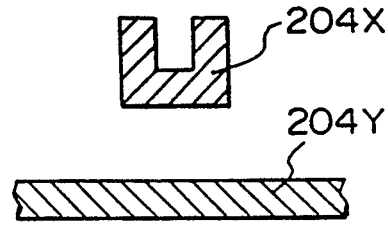

In cases where the signal lines 204 X and 204Y cross over as illustrated in an example shown in FIG. 33 (a), it is important to ascertain that the interference effects, such as coupling and parasitic effects, are minimized by minimizing the opposing areas of the conductors. A technique of undertaking such a task is made easier by having a configuration illustrated in FIG. 33 (b). A T-shaped line, having a low area in the signal line opposing the ground line, would be useful in such a case.

APPLICATION OF SIDEWALL PLATING TECHNIQUE TO FABRICATION OF AIR BRIDGE STRUCTURES

Background of the Invention

Air bridge structures are essential in IC fabrication. They are particularly important to three dimensional architecture to provide for the circuits to cross over each other to permit building up vertical circuit patterns.

In the conventional air bridge structures, the span length is limited because the structure cannot stand the loading imposed by its own weight. Attempts have been made to increase the strength of air bridge structures by having a composite material of gold with a rhodium core. But the effect is at best an improvement of only a factor of several times, and significant strength improvement could not be expected from such an attempt.

The deflection, $D_f$ of an air bridge structures is given by an expression:

$$D_f = L^4 / E \cdot W \cdot T^2$$

where L is the span length of the air bridge structure, E is the Young's modulus of the material, W and T are, respectively the width and the thickness of the conductor constituting the air bridge structure viewed in the direction of the signal passage.

Therefore, it can be seen that an increase in the value of T would significantly decrease the value of $D_f$, in other words, to lead to an increase in the load carrying capacity.

In changing the cross sectional shape of an air bridge structure, it is not necessary to increase the entire thickness of the conductor. It is only necessary to increase the edge portions, as in the vertical line elements of a U-shaped conductor. The fabrication techniques of the sidewall plating is ideally suited t fabricating such cross sectional shapes, as described earlier under the section dealing with the sidewall plating technique.

Therefore, the application of the sidewall plating technique to the fabrication of an air bridge structure, provides, in addition to providing all the electrical performance benefits accruing from the U-shaped conductors mentioned before, a structure having a high resistance to deflection.

Preferred embodiments

The air bridge structures made in a N&D configuration enables a high packing density and miniaturization of IC devices.

Some air bridge structures have been illustrated in earlier examples, but other examples will be shown which illustrate the advantages of the sidewall plating to produce air bridges having a long span yet have a high structural integrity. A few cases of the cross sectional shapes of a typical air bridge structure, shown in FIG. 34 (a), and taken at a plane I—I' are illustrated in FIGS. 34 (b), (c) and (d). The shapes (b) and (d) have been fabricated by the sidewall plating technique. But it is obvious that other cross sectional shapes can be fabricated by the same technique. The cross sectional shape of FIG. 2 (g) corresponds with FIG. 34 (b); FIG. 6 (d) corresponds with FIG. 34 (c) and FIG. 7 (f) corresponds with FIG. 34 (d).

APPLICATION OF SIDEWALL PLATING TECHNIQUE TO INDUCTIVE ELEMENTS

Background of the Invention

Traditionally, an inductive element in the plan view is spiral shaped, and the cross sectional shape of the conductor is chosen so as to achieve a given inductance value within a circuit. In order to lower the circuit resistance by increasing the cross sectional area of the conductor, it is a usual practice to increase the width of the conductor more than twice the dimension of the skin effect. However, the conventional fabrication techniques do not allow the thickness of the conductor to be increased easily. If an attempt is made to simply increase the conductor thickness, the circuit resistance did not decrease in proportion to improve the circuit performance because of the prevalent skin effect.

Furthermore, such conventional inductors required a large accommodation area, and the packing density could not be increased easily and impeded the progress toward miniaturization of IC devices.

Technically also, the value of one turn of an inductor was fairly high because of the large size of the conductive line, and therefore, it was not possible to fine tune a circuit performance.

Summary of the Invention

An object of the present invention is to decrease the parasitic interference caused by the interaction of an inductive element with the ground current by virtue of the increased area of the conductor as well as sufficient allowance for the prevalent skin effect.

A further object of the present invention is to decrease the resistance of the inductive element and the area of occupation so as to increase the packing density and thereby to achieve miniaturization of IC devices for microwave transmission equipment.

Another object of the invention is to apply the technique of sidewall plating to the fabrication of inductive elements so as to produce inductors of a suitable cross sectional area which provides an increased conductive area and permits a high packing density in an IC circuit.

Still another object of the invention is to provide an inductor having a low inductive value per turn so as to enable fine tuning of a circuit performance a' an early design stage.

Preferred Embodiments

A first preferred embodiment will be described with reference to FIGS. 35 (a) and (b). As shown in the plan view, the inductor is a spiral element, having an inner terminal in contact with the insulating substrate material 1, a central conducting line element which is air bridged and an outer terminal disposed on a plane a distance away from the substrate material 1. The cross sectional shape of each section of the conductor 401 is fabricated by the process illustrated in FIGS. 2 (a) to (g) used in fabricating the left side conductor. The cross sectional shape of the inductor is such that the vertical height is very much larger than the width of the conductor, thereby increasing the conductive area as well as decreasing the parasitic interferences.

This air bridge 409 which is also made by the application of the sidewall plating technique.

A second embodiment will be described with reference to FIGS. 36 (a) and (b). The inductor has a basic structure, consisting of an inner terminal, a central line element and an outer terminal. The inductor in this embodiment comprises a double layer conductor consisting of an upper conductor 401b and a lower conductor 401a. The inner terminal and the lower conductor are in contact with the substrate material 1 and has a terminal end 403a over which the upper conductor 401b crosses over, and this cross over region is provided with a wide terminal connector region M. The terminal 403a is connected to the upper conductor 401b. The line element is in contact with the substrate material in the regions marked "P" and "Q" in order to provide structural support to the line.

The reason for having this wide region is to compensate for the lack of a conductive layer in this cross over region by providing an region of low resistance, so that the overall circuit resistance will remain low.

Figure 36A:
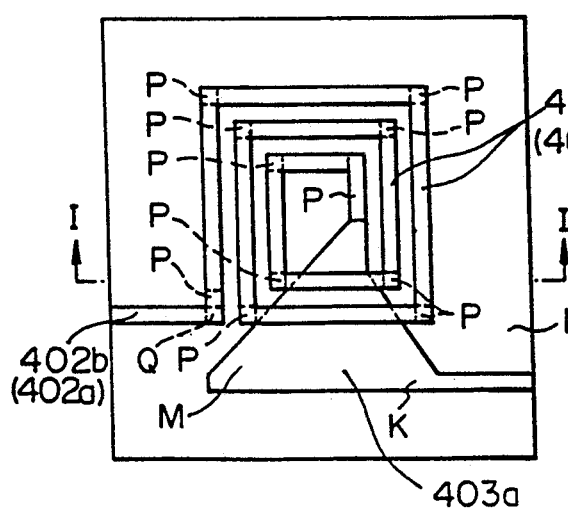
FIGS. 36a and 36b show an application example an inductive element having low circuit resistance at the inner terminal end fabricated by the sidewall plating technique.
Figure 36B:
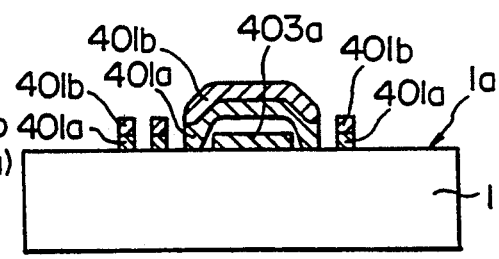
Figure 37A:
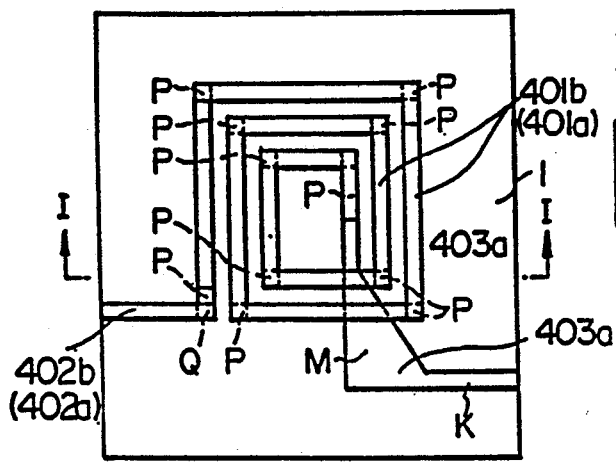
FIGS. 37a and 37b show an another example to lower the circuit resistance of the lines in an inductive element fabricated by the sidewall plating technique.
Figure 37B:
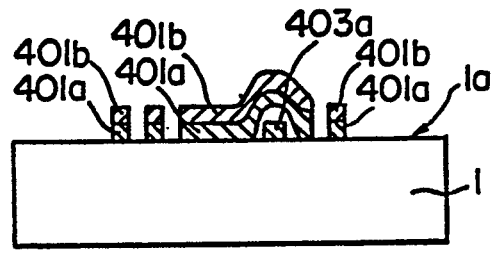

A third embodiment is shown with reference to FIGS. 37 (a) and (b). The basic spiral structure is similar to the one shown in FIG. 36, and is a double conductor structure comprising an upper conductor 401b and a lower conductor 401a. This embodiment illustrates that the above effect of circuit resistance can be achieved by using a minimum area of opposition as shown in this embodiment.

Figure 35A:
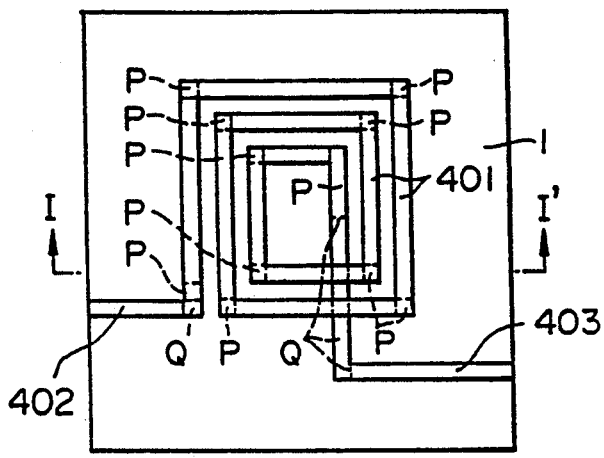
FIGS. 35a and 35b show an example of an air bridged inductive element fabricated by the application of the sidewall plating technique.
Figure 35B:
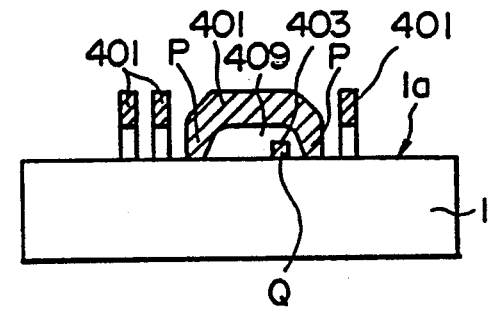
Figure 38A:
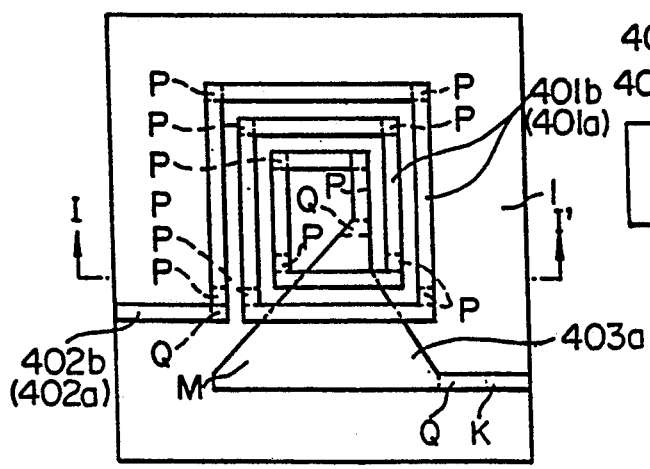
FIGS. 38a and 38b show an air bridged variation of the example shown in FIGS. 36a and 36b.
Figure 38B:
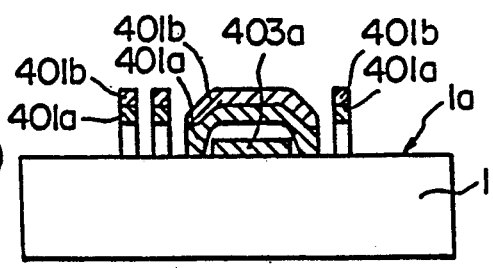

A fourth embodiment illustrated in FIGS. 38 (a) and (b) is a combination variation of the embodiments illustrated in FIGS. 35 and 36 to provide a further opportunity for fabricating a cross-over inductor having an air bridge structure and low circuit resistance and parasitic interferences.

Figure 39A:
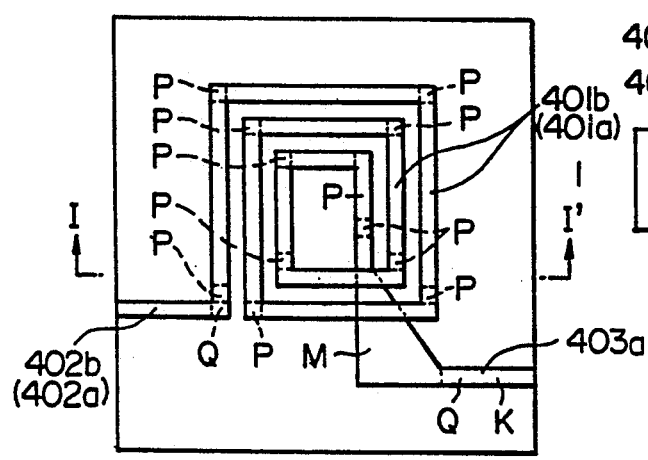
FIGS. 39a and 39b show an air bridged variation of the example shown in FIGS. 37a and 37b.
Figure 39B:
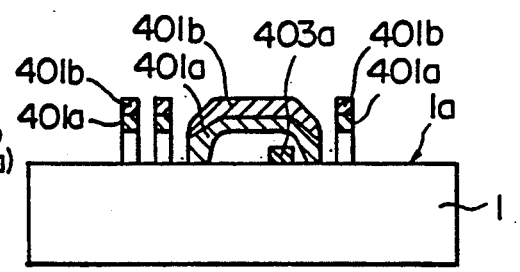

A fifth embodiment illustrated in FIGS. 39 (a) and (b) is a combination variation of the embodiments illustrated in FIGS. 35 and 37 to provide a case of a minimum connector area for fabricating a cross-over inductor having an air bridge structure and low circuit resistance and parasitic interferences.

Figure 40A:
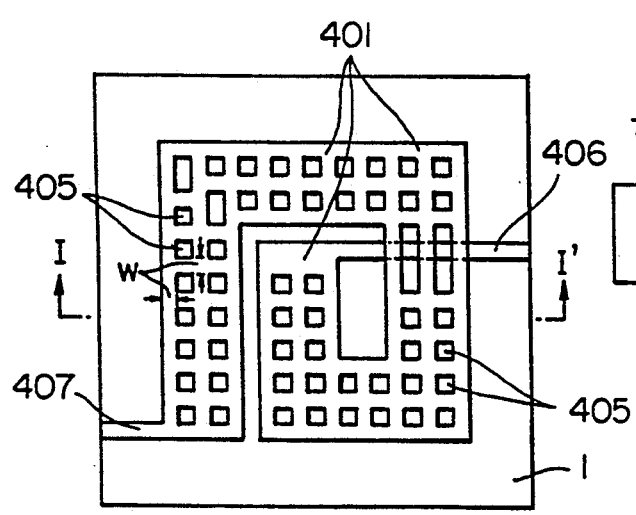
FIGS. 40a and 40b show a spiral inductive element consisting of sidewalls to lower the parasitic interference and lower the circuit resistance.

FIGS. 40(a) and (b) illustrate an embodiment of inductor comprising a series of inductive elements 401 shaped in a N&D configuration spaced with spacing 405. Each inductive element 401 has a width W and a depth D in appropriate relation to the skin effect depth $\delta$ as follows. The depth D is equal to or more than twice the value of $\delta$ while the width W is equal to or less than twice the value of $\delta$. Therefore, the circuit resistance of the inductor decreases almost inversely with the dimension of D.

Figure 40B:
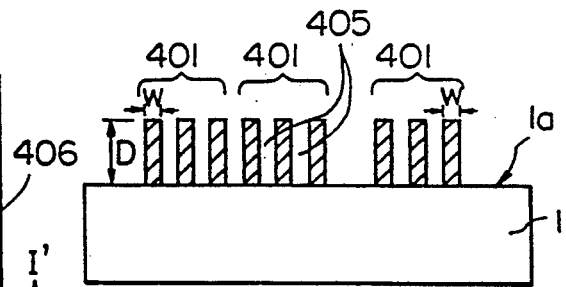
Figures 41A, 41B:
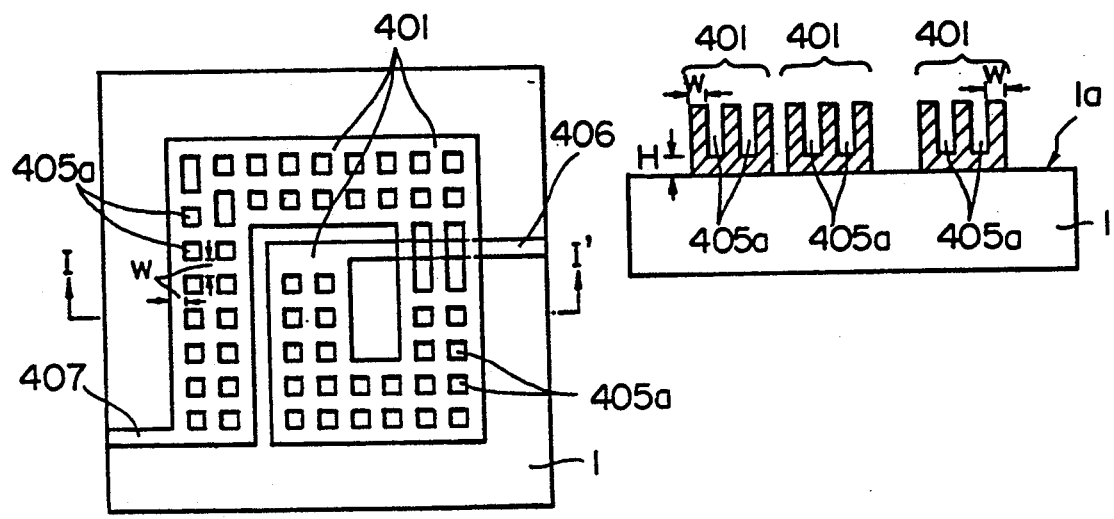
FIGS. 41a and 41b show another variation of the inductive element shown in FIG. 41.

FIG. 41 is a further improved embodiment over the configuration the embodiment shown in FIG. 40 provided by the provision of connected inductive elements to further decrease the parasitic interferences and minimize the skin effect.

Figure 42:
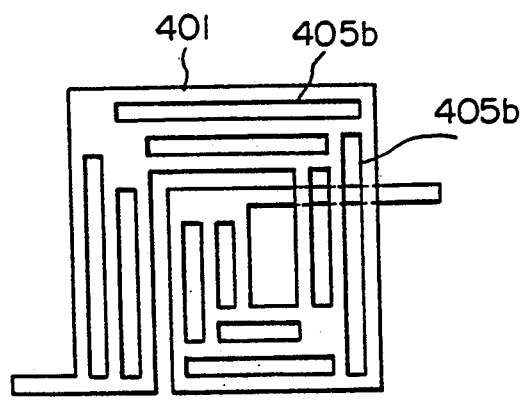
FIG. 42 is a plan view of another improved variation of the inductive element shown in FIG. 41.
Figure 43L:
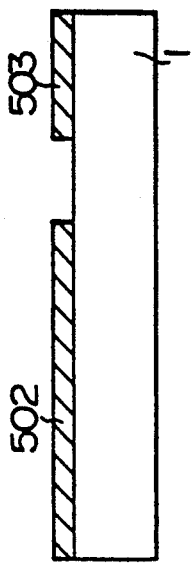
Figure 43M:
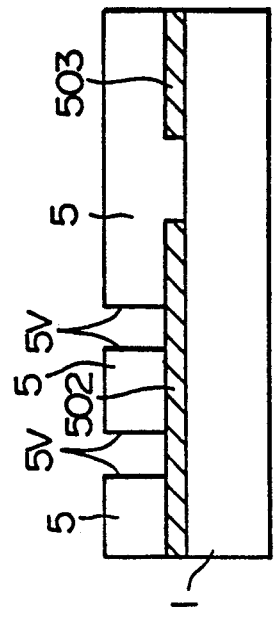
Figure 43N:
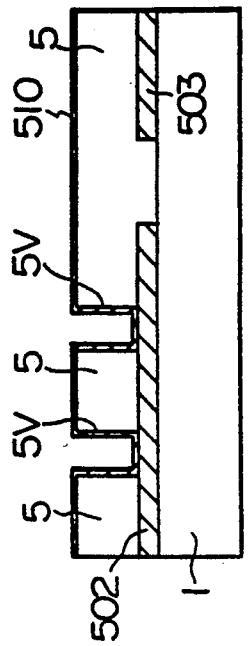
Figure 43A:
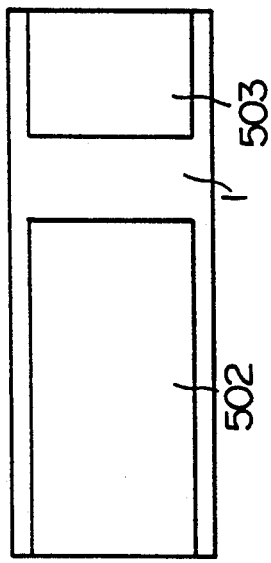
Figure 43B:
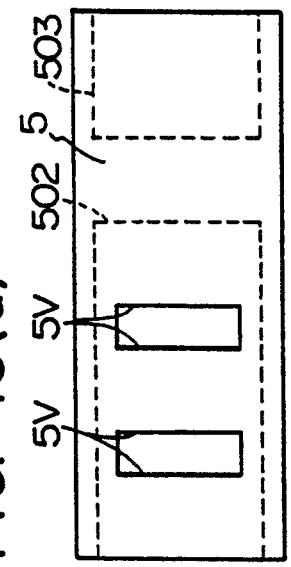
Figure 43C:
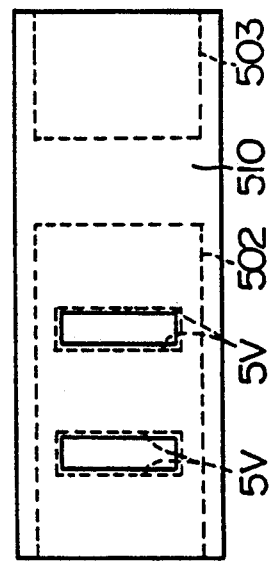
Figure 43D:
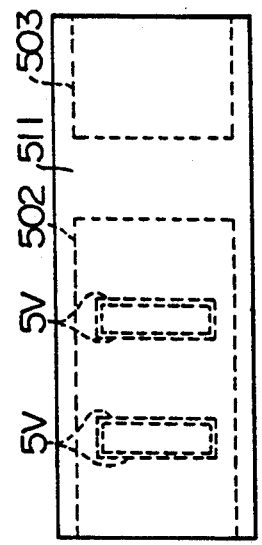
Figure 43E:
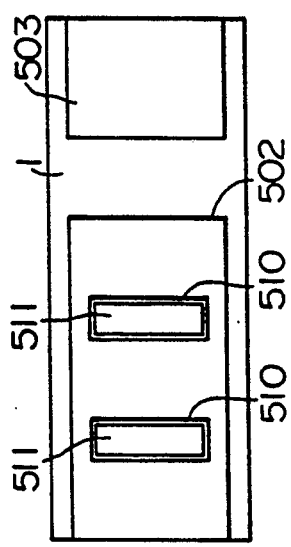
Figure 43F:
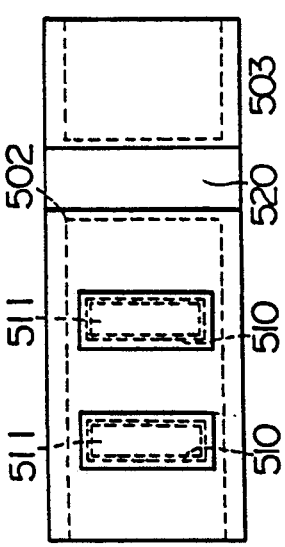
Figure 43O:
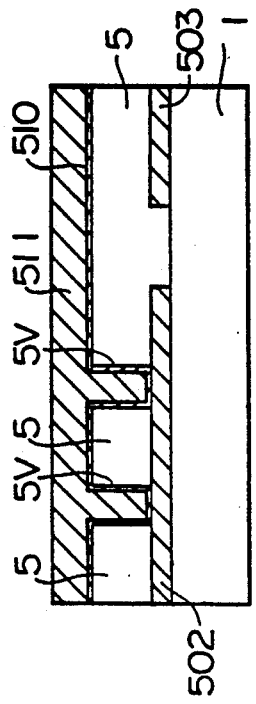
Figure 43P:
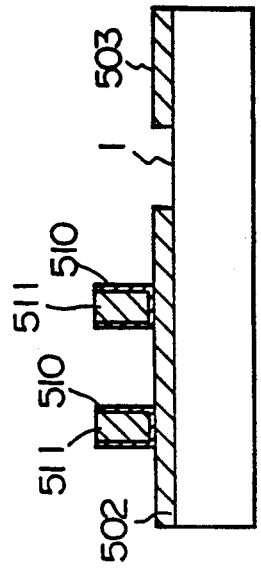
Figure 43Q:
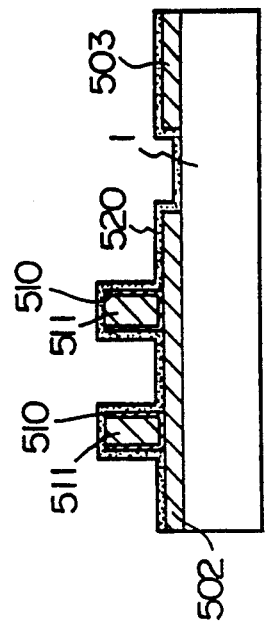
Figure 44B:
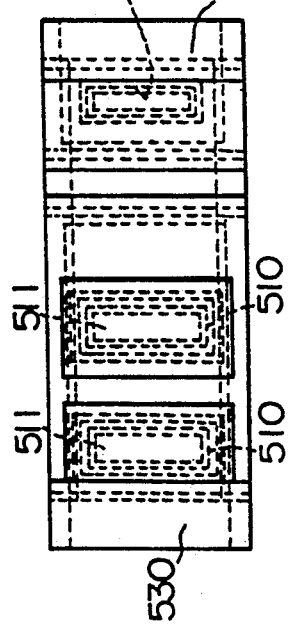
FIGS. 44a-44d are plan views illustrating the steps for fabricating a capacitive element having a thick second conductive layer, according to the sidewall plating technique FIGS. 44e-44h being cross sectional views of FIGS. 44a-44d.
Figure 44C:
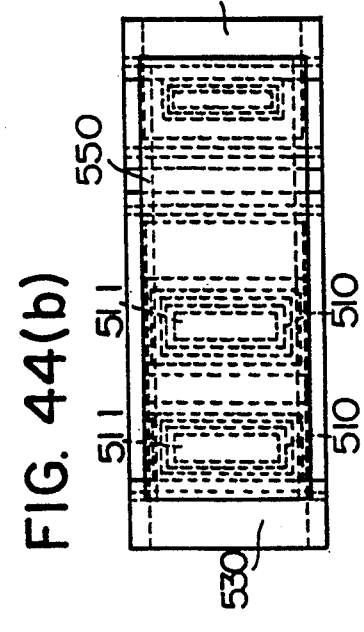
Figure 44D:
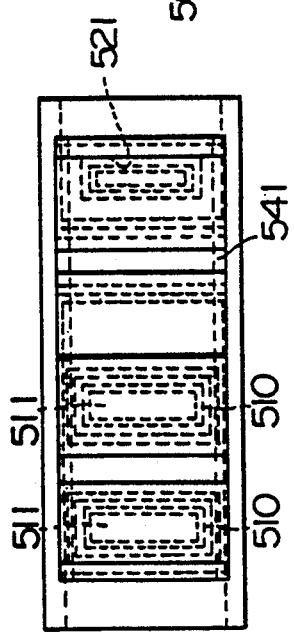
Figure 44F:
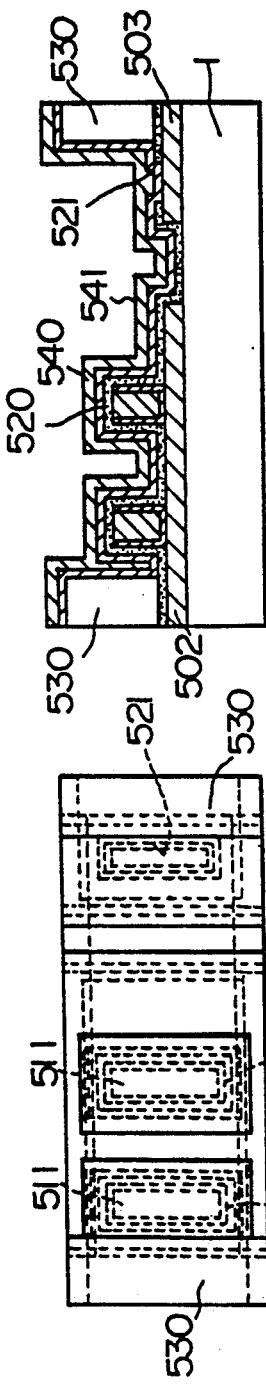
Figure 44G:
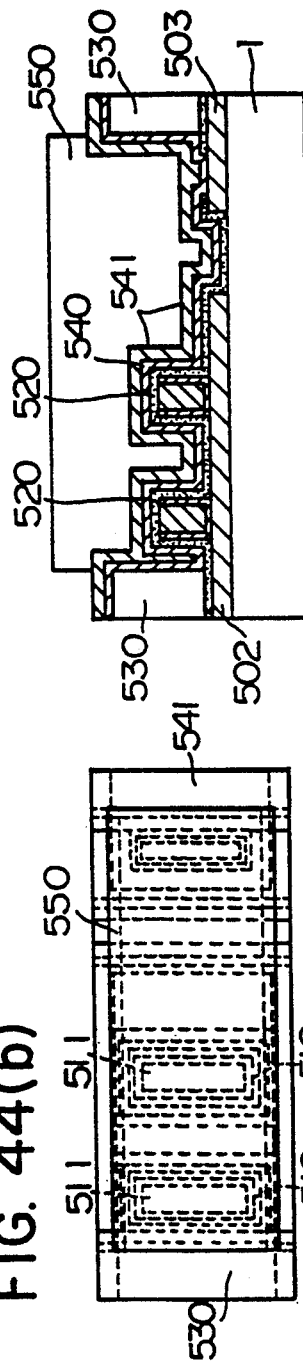
Figure 44H:
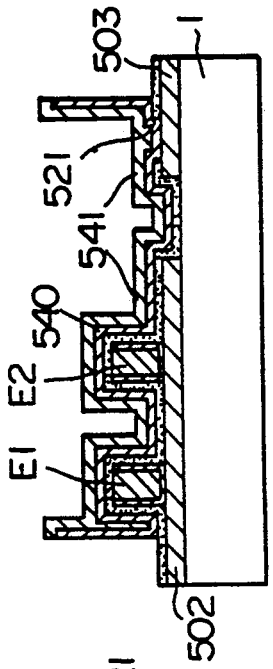
Figure 46G:
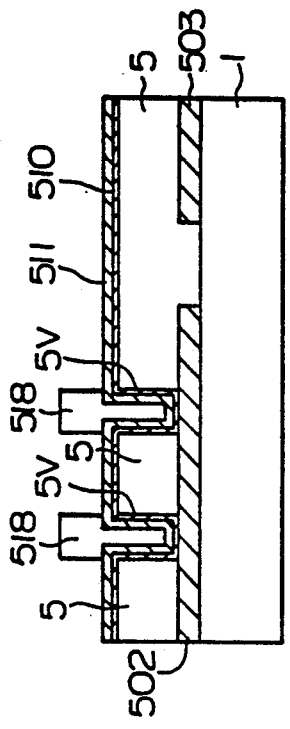
FIGS. 46e–46h being cross sectional views of FIGS. 46a–46d.
Figure 46H:
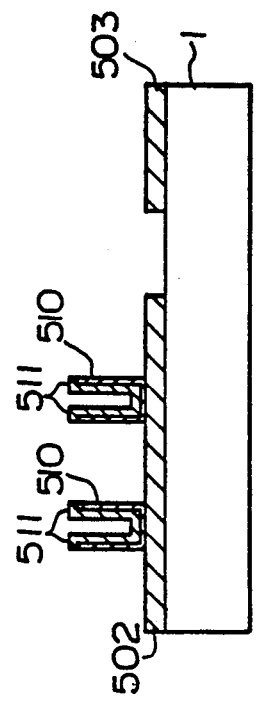
Figure 46C:
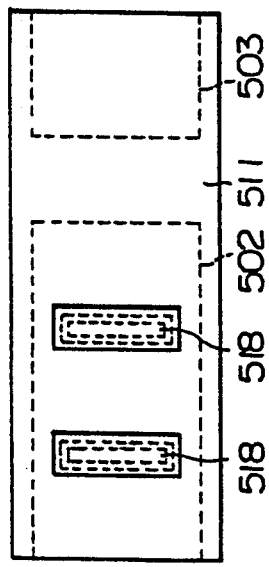
FIGS. 46a–46b are plan view illustrating the steps for fabricating U-shaped first and second electrodes.
Figure 46D:
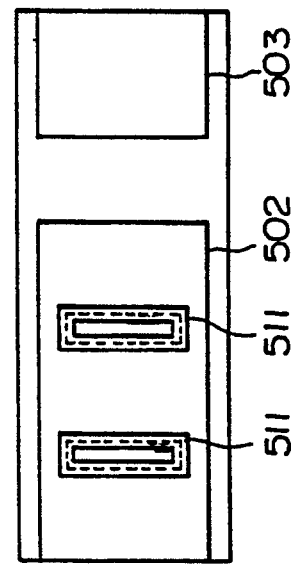
Figure 49A:
FIGS. 49a–49o illustrate the steps for fabricating the electrodes in a FET device on a GaAs substrate material, according the sidewall plating technique.
Figure 49B:
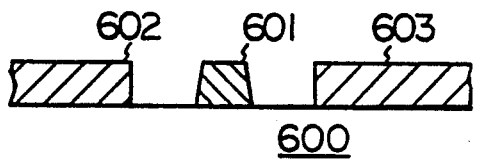
Figure 49C:
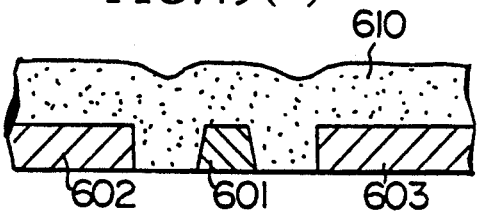
Figure 49D:
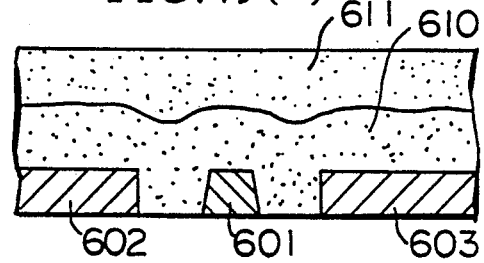
Figure 49E:
Figure 49F:
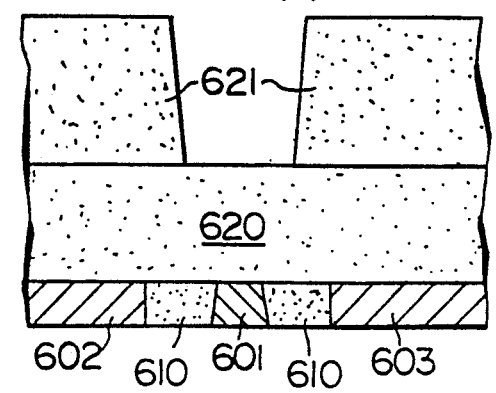
Figure 49G:
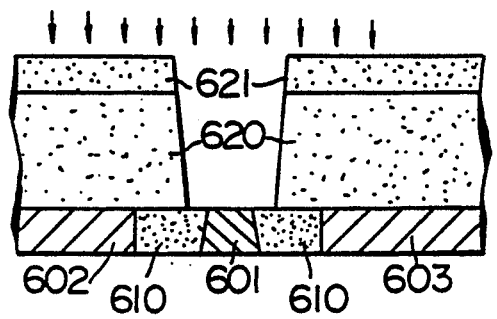
Figure 49H:
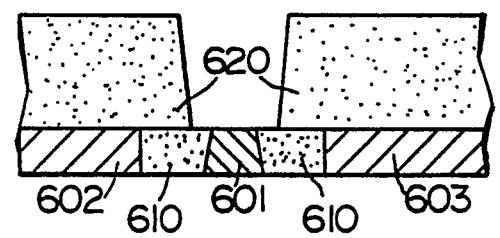
Figure 49I:
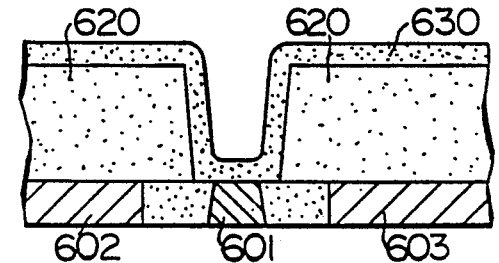
Figure 49J:
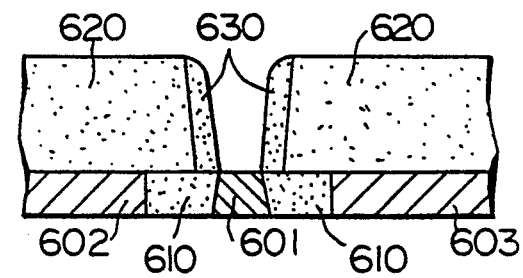
Figure 49K:
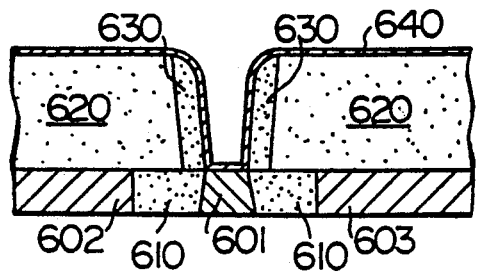
Figure 49L:
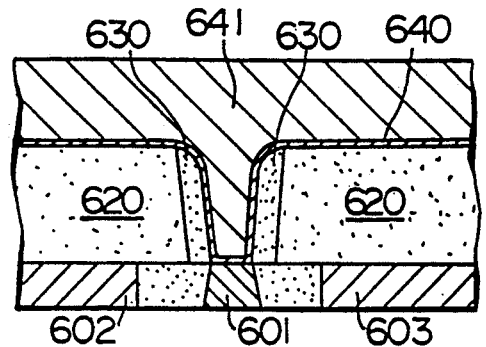
Figure 49M:
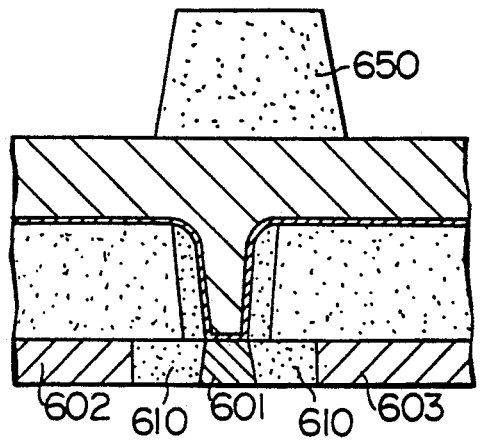
Figure 49N:
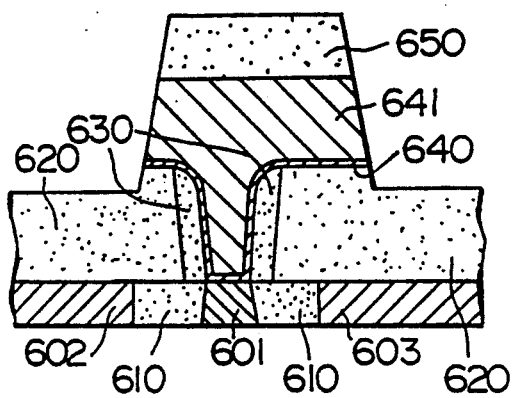
Figure 49O:
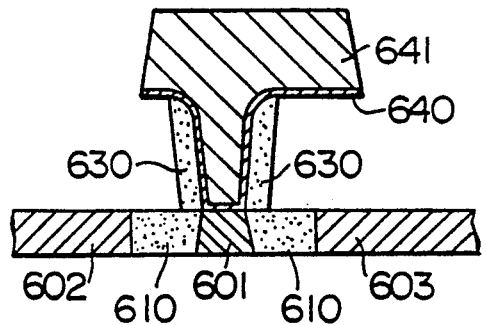

FIG. 42 illustrates a further embodiment of improved inductor by having the inductive elements arranged in opposing pairs so as to further minimize parasitic interferences and the skin effect.

APPLICATION OF SIDEWALL PLATING TO CAPACITIVE ELEMENTS

Background of the Invention

The conventional capacitors used in integrated circuits for communication purposes are constructed of two conductive plates surrounding a dielectric material. The conductive plates are usually in the form of plates having a planar surface, and their manufacturing steps do not include surface patterning to increase their surface area.

Such a structure imposes basic performance limitations since the inductive capability of the capacitors is directly related to their surface area. Consequently, increasing the size of the capacitor is a traditional technique of overcoming the basic limitation and increasing their performance capability. This action however decreases the ability of the capacitors to be packed densely and is counter to the modern demand of achieving a high packing density and miniaturization of ICs. Therefore, there has been a demand for a practical technique for increasing the surface area of capacitors, but there has not been an effective technique of production.

The purpose of the present invention is to apply the technique of sidewall plating to manufacturing of capacitive elements so as to produce high performance capacitive elements which can be produced by the usual steps of IC manufacturing.

Preferred Embodiments

A first preferred embodiment for fabricating a capacitive element will be described.

The fabrication steps are divided into two groups: first electrode processing steps and second electrode processing steps.

The details of the first electrode processing will be presented first with reference to an embodiment shown in FIGS. 43 (a) to (e).

On an insulating substrate 501, a first conductive layer 502, such as gold, is formed throughout, from which conductive layers 502 and 503 are fabricated as shown in FIG. 43 (a).

Next, an deposition masking layer 5, such as a polyimide film, is formed on the conductive layer 502, to define two window regions having vertical side walls 5V and window cavities of a N&D configuration as shown in FIG. 43 (b).

A conductive layer 510, such as gold is sputtered throughout on the insulating film (deposition masking) 5, including the vertical walls 5V as shown in FIG. 43 (c).

A conductive metal deposit 511, such as gold, is deposited, on top of the conductive layer 510 throughout in such a way to fill in the window cavities completely, as shown in FIG. 43 (d) using the sputtered layer 510 as an electrode in an electroplating process.

By suitable masking and removing steps, such as photoresist masking followed by ion milling, the structure shown in FIG. 43 (e) is produced.

The above steps complete the fabrication of the first electrodes.

The processing steps involved in fabricating the second electrode will be presented with reference to FIGS. 43 (f) to (k).

As shown in FIG. 43 (f), on top of the first electrode formed above, a dielectric layer 520 such as SiO2, SiN or SiON is formed.

An insulating photoresist masking is formed on top of the dielectric layer 520 so as to form a second window region 521 as shown in FIG. 43 (g) for a throughole.

The next step, shown in FIG. 43 (h) is to form another photoresist layer 530 on the dielectric layer 520.

Another conductive layer 540 is formed on top of the photoresist layer 530 by such technique as sputtering, as shown in FIG. 43 (i).

A photoresist masking layer 550 is formed next, on top of the sputtered layer 540, excluding the region to be fabricated into second electrode, as shown in FIG. 43 (j).

Next, according to the masking pattern defined above, the conductive layer 520 is removed by a suitable technique such as ion milling, followed by the removal of the photoresist layer 550 with a suitable removing technique, such as dissolution, to form a section shown in FIG. 43 (k), thereby forming a pair of electrodes E1 and E2 which act as a high performance capacitive element having an increased capacitive area and are packed in a limited space available on an IC substrate material 1.

A second embodiment is described in terms of the processing steps shown in FIGS. 44 (a) to (d) which are performed after the step (i) illustrated in FIG. 43.

The section obtained in the step illustrated in 43 (i) is reproduced in FIG. 44 (a). This structure is treated further by depositing another thick conductive layer 541 on top of the previous conductive layer 540, as shown in FIG. 44 (b), with the use of the sidewall plating technique. The conductive layer 540 formed in the previous step becomes a plating electrode in this deposition step. The advantage of this process is that the deposit thickness can be increased rapidly, and adjusted to any desired thicknesses relatively easily compared with other thick layer forming processes.

The photoresist masking step is again performed at this stage as shown in FIG. 44 (c) to produce the structure shown in FIG. 44 (d).

When it is necessary to produce a long strip conductor of wide width, a third embodiment, a variation of the above processing steps as shown in an embodiment shown in FIGS. 45 (a) to (d), can be utilized. This type of configuration is useful for lowering the resistance of the second electrode, and is expected to also provide a flat platform on which to fabricate other multilayer circuits thereon.

Starting with the structure which was shown in FIG. 43 (i), similar processing steps as in the previous process can be performed as illustrated in FIGS. 45 (a) to (d). In the deposition step, the plating process is continued until the desired planarity is obtained as illustrated in FIG. 45 (b). Photomasking and dry etching steps are performed to obtain the structure shown in FIGS. 45 (c) and (d), respectively.

This type of structure is advantageous in reducing the parasitic inductances between the signal carrying conductors in which the signal flows perpendicular to the plane of the paper.

When it is necessary to increase the packing density of the capacitive elements and achieve higher performance, the structure example shown in FIG. 46 (d) can be utilized to increase the surface area associated with each element as well as to increase the number of elements which can be fabricated on a given area.

Starting with one of the basic structures which was shown in FIG. 43 (c) and is reproduced in FIG. 46 (a), the deposition step is performed to deposit a metal conductor 511 into the window cavity using the sputtered layer an a plating electrode.

The metal deposit is deposited along the wall 5V to produce a U-shaped deposit 511 in the window cavity, as shown in FIG. 46 (b).

A photoresist masking step shown in FIG. 46 (c) and an etching step shown in FIG. 46 (d) complete this fabrication process to produce the structure shown in FIG. 46 (d).

Figure 47A:
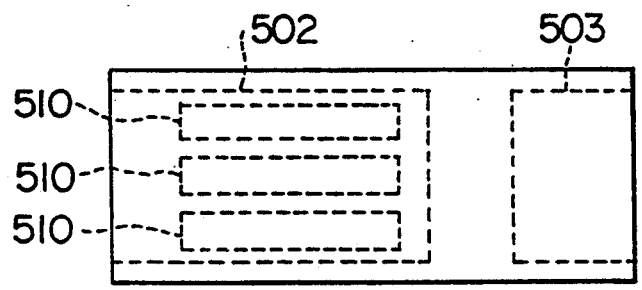
FIGS. 47a and 47b illustrate an example of a capacitive element having reduced parasitic inductance and an example of reducing skin effect by enlarging the conductive surface area.
Figure 47B:
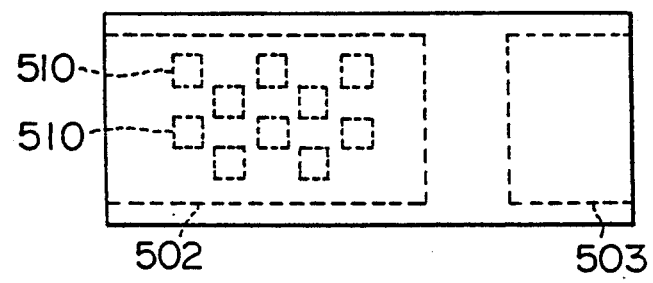

The performance characteristics of the capacitor can be improved by increasing the surface area in special configuration achievable by the sidewall plating technique as strips shown in the plan view of an example shown in FIGS. 47 (a), or as square rods shown in FIG. 47 (b). In these configurations, the first and the second electrodes protrude from the substrate material. The configuration shown in (b) has larger electrode surface area than the one shown in (a), but the practical fabrication problems are also more sever in the configuration of (b), largely caused by the high degree of resolution required to properly lay out the electrode pattern.

Figure 48:
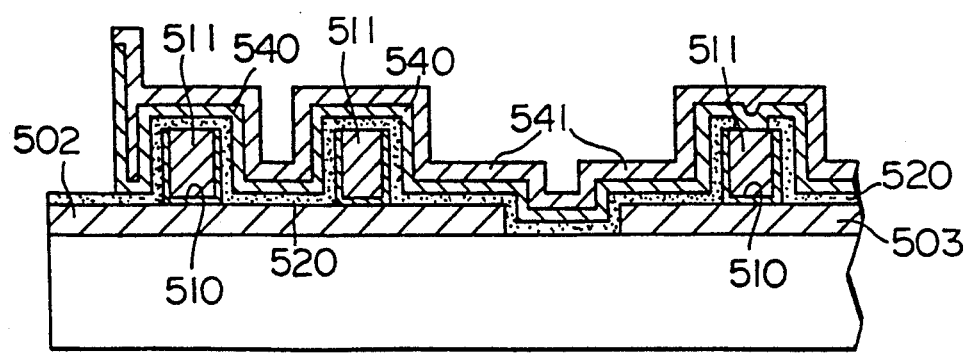
FIG. 48 illustrates an example of a variation in the takeout lead of the second electrode.
Figure 50A:
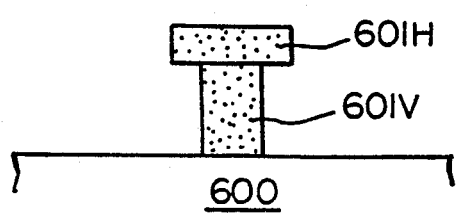
FIGS. 50a–50g illustrates the steps for fabricating a gate electrode in a FET device on a GaAs substrate material.
Figure 50B:
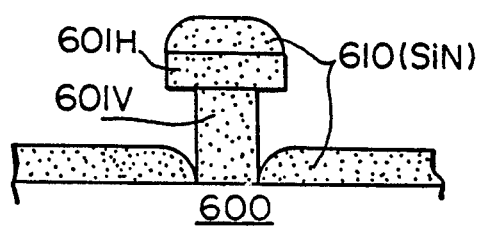
Figure 50C:
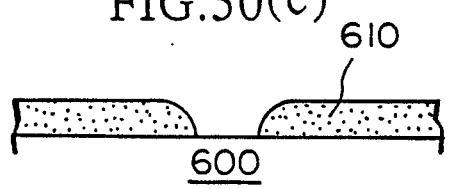
Figure 50D:
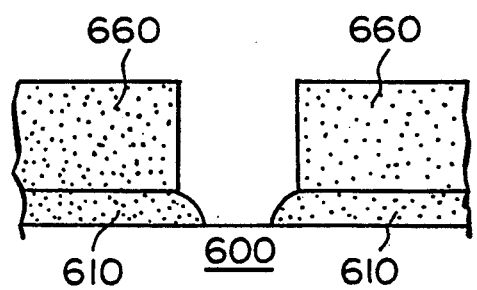
Figure 50E:
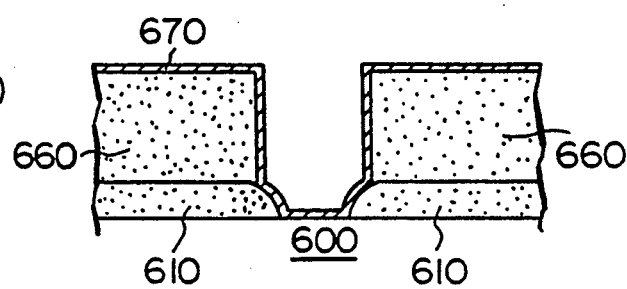
Figure 50F:
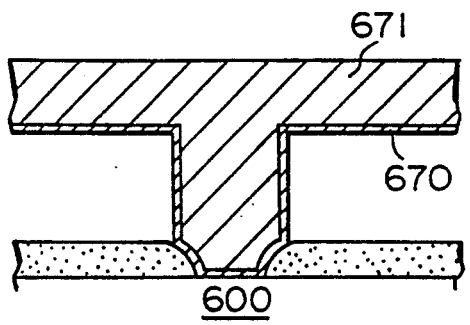
Figure 50G:
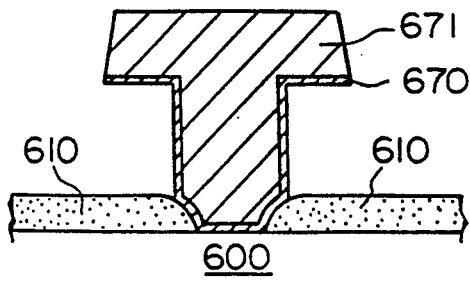

FIG. 48 illustrates an embodiment of a variation of the take out lead for the second conductor which can be arranged as shown in this figure. The advantage of this arrangement is that the second electrode can be made thick, and also provides an alternative arrangement for a throughhole location.

APPLICATION OF THE SIDEWALL PLATING TECHNIQUE TO FABRICATION OF FET DEVICES

The performance of MMIC is improved by improving the gate electrode performance FET by the application of the sidewall plating technique. The narrow and deep gate electrode is expected to improve the power gain and would thus shift the value of the cutoff frequency to high frequencies. An example of the would be steps for fabricating a FET with the application of the sidewall plating technique are illustrated in FIGS. 49 (a) to (o):

(a) A film of W-system material (e.g. WSiN) is sputtered on a semiconducting GaAs substrate material 600;

(b) a gate masking pattern is formed on the sputtered film and a gate 601 is fabricated by dry etching with a gaseous substance such as $CF_4$ or $SF_6$ to produce a structure illustrated in FIG. 49 (a), so-called high melting temperature metal gate or by the process of so-called self-aligning SAINT technique;

(c) next, forming a layer of AuGe/Ni and heat treating at around 420° C. to form a source and a drain electrode, shown in FIG. 49 (b);

(d) forming a first insulation layer 610 on the surfaces of the gate electrode 601 and the substrate material 600, as illustrated in FIG. 49 (c);

(e) forming a planarization photoresist layer 611, as illustrated in FIG. 49 (d);

(f) etching the photoresist layer 611 and the insulation layer 610 successively to expose the gate electrode surface, as illustrated in FIG. 49 (e);

(f) forming a second insulation layer polyimide film 620 on the insulation layer 610 and the electrodes 602, 603 and the gate electrode 601;

(g) forming photoresist layer 621 defining the window region and the window cavity on the insulation layer 620, as illustrated in FIG. 49 (f);

(h) forming a third insulation layer 630, such as $SiO_2$, on the window so as to form a cavity above the gate electrode 601, as illustrated in FIG. 49 (i);

(i) removing the region of the third insulation 630 so as to expose the surface of the gate electrode 601, as illustrated in FIG. 49 (j);

(j) forming a first conductive layer 640 on the surface of the exposed gate electrode 601 and the sidewall of the cavity, as illustrated in FIG. 49 (k);

(k) depositing a second conductive layer, gold, in on the surface of the first conductor and inside the window cavity so as to form a gold deposit, in the window cavity using the first conductive layer 640 as a plating electrode, as illustrated in FIG. 49 (1);

(l) forming a gate electrode masking layer 650 on the surface of the gold deposit 641, as illustrated in FIG. 49 (*m*);

(m) removing the conductive layer 640 and the deposit 641 so as to form upper electrode contact region, as illustrated in FIG. 49 (*n*);

(n) removing the second insulation layer 620 to expose the third insulation layer 630 so as to form a circuit means acting as a FET device as illustrated in FIG. 49 (*o*).

In forming the gate electrode, it is desirable to have the depth of gate as deep as practicable so as to minimize the interference effects. The would be processing steps to achieve the desired depth of the gate electrode with the use of the sidewall plating technique are illustrated in FIGS. 50 (*a*) to (*g*). It is also desirable to shape the edges of the first insulation layer of SiO₂, appropriately. The desired shape profile of the gate electrode can be achieved by the use of a dummy gate, as illustrated in FIGS. 50 (*a*) and (*b*).

A dummy gate having a vertical element 601H and a horizontal element 601V is formed from a photoresist material on the surface of a GaAs substrate material 600, as illustrated in FIG. 50 (*a*).

A first insulation layer 610 of SiO₂ is formed on the surface of the dummy gate and the substrate material 600, as illustrated in FIG. 50 (*b*).

The dummy gate made of the photoresist material 601 is removed to form a structure shown in FIG. 50 (*c*).

A window cavity is formed on a polyimide film 660 on the first insulation layer 610 to define the window region as illustrated in FIG. 50 (*d*).

A first conductive layer 670 is sputtered onto the surface of the polyimide film 660, as illustrated in FIG. 50 (*e*).

A second conductive layer, in the form of a metal deposit 671, is formed by means of electroplating so as to fill the cavity as shown in FIG. 50 (*f*).

After the steps of forming a photoresist layer on the metal deposit to define the electrode shape, removing the metal deposit 671 and the conductive layer 670 and removing the photoresist layer by ashing, a structure shown in FIG. 50 (*g*) is produced to complete the fabrication of a gate having a depth and desirable characteristics to minimize signal interferences.

What is claimed is:

1. A circuit means in an integrated circuit fabricated on a semiconductor substrate, comprising:
   signal transmission means, extending from the substrate, for transmitting signals; and
   ground line means separated from said signal transmission means;
   wherein at least one of said transmission means and said ground line means has a cross-sectional shape including a rectangular portion, the vertical size of which is longer than the horizontal size thereof.

2. The circuit means of claim 1, wherein
   the ground line means is a planar ground conductor parallel to the substrate and
   the signal transmission means is a vertically disposed opposing conductive body extending from the planar ground conductor and substrate and having a cross-sectional shape of one of an I, a T, and L, a U, and an inverted L; the circuit means including an insulative layer between the planar ground conductor and the conductive body.

3. The circuit means of claim 1, wherein the signal transmission means and the ground line means each have a rectangular portion extending from the substrate, the ground line means parallel to and spaced from the signal transmission means, at least one of said signal transmission means and said ground line means has a cross-sectional shape of one of an I, a T, an L, a U, and an inverted L, the circuit means including an insulative layer between the ground line means and the signal transmission means.

4. The circuit means of claim 1, wherein the signal transmission means includes a rectangular portion attached to and extending from the substrate and
   the ground line means includes a pair of ground lines parallel to and spaced equidistant from the rectangular portion of said signal transmission means;
   wherein at least one of said signal transmission means and said ground lines has a cross-sectional shape of one of an I, a T, an L, a U, and an inverted L.

5. A spiral inductive line element comprising a vertical strip of a rectangular cross sectional shape formed on a horizontal insulating substrate material, wherein said line element is in contact with the substrate material locally in spots to support remaining portions of the line element above the substrate material and said line element has a cross-sectional shape of one of an I, a T, an L, a U, and an inverted L.

6. A inductive line of a vertical rectangular cross sectional shape, having a width and a depth; said inductive line comprising:
   an inner terminal end adapted for use as a lead-in terminal and
   a spiral central line element, wherein:
   (a) said inner terminal end is formed on an horizontal insulating substrate material wherein the width of the inner terminal is widest at an outer section, and becomes narrower toward an innermost portion of said inner terminal; and
   (b) said inductive line element is formed on a plane distally separated from the substrate material.

7. The inductive line element as claimed in claim 6, wherein said inner terminal end is disposed on said distal plane, and said inductive line element is disposed on the substrate material.

8. The inductive line element as claimed in claim 6, wherein the line conductor is in contact with the substrate material locally to provide structural support while the rest of the portion of the line element are separated away from the substrate material; and wherein the inner terminal end, including the innermost circular section, is in contact with the substrate material.

* * * * *

UNITED STATES PATENT AND TRADEMARK OFFICE
CERTIFICATE OF CORRECTION

PATENT NO. : 5,281,769
DATED : January 25, 1994
INVENTOR(S) : Makato Hirano et al It is certified that error appears in the above-indentified patent and that said Letters Patent is hereby corrected as shown below:

On the title page, item [54] and column 1, line 2 change "DEWALL" to —SIDEWALL—.

Signed and Sealed this

Thirteenth Day of September, 1994

Attest:

BRUCE LEHMAN

*Attesting Officer*     *Commissioner of Patents and Trademarks*